United States Patent
Kato et al.

(10) Patent No.: US 11,257,832 B2
(45) Date of Patent: Feb. 22, 2022

(54) SEMICONDUCTOR MEMORY DEVICE AND METHOD FOR MANUFACTURING SAME

(71) Applicant: Kioxia Corporation, Minato-ku (JP)

(72) Inventors: Tatsuya Kato, Yokkaichi (JP); Fumitaka Arai, Yokkaichi (JP); Katsuyuki Sekine, Yokkaichi (JP); Toshiyuki Iwamoto, Mie (JP); Yuta Watanabe, Yokkaichi (JP); Wataru Sakamoto, Yokkaichi (JP); Hiroshi Itokawa, Oita (JP)

(73) Assignee: Kioxia Corporation, Minato-ku (JP)

( * ) Notice: Subject to any disclaimer, the term of this patent is extended or adjusted under 35 U.S.C. 154(b) by 9 days.

(21) Appl. No.: 15/684,286

(22) Filed: Aug. 23, 2017

(65) Prior Publication Data
US 2017/0352671 A1    Dec. 7, 2017

Related U.S. Application Data

(63) Continuation of application No. PCT/JP2015/056097, filed on Mar. 2, 2015.

(51) Int. Cl.
*H01L 27/11556* (2017.01)
*H01L 27/11521* (2017.01)
(Continued)

(52) U.S. Cl.
CPC .. *H01L 27/11556* (2013.01); *H01L 27/11521* (2013.01); *H01L 29/42324* (2013.01);
(Continued)

(58) Field of Classification Search
CPC ......... H01L 27/11556; H01L 27/11521; H01L 29/66825; H01L 29/788; H01L 29/7881; H01L 29/7887; H01L 29/7889
See application file for complete search history.

(56) References Cited

U.S. PATENT DOCUMENTS 9,240,416 B2    1/2016 Shimura et al.
2007/0132004 A1*   6/2007 Yasuda ............ H01L 21/28273
                                                        257/315
(Continued)

FOREIGN PATENT DOCUMENTS

CN          103403861 A       11/2013
JP          2011-114057        6/2011
(Continued)

OTHER PUBLICATIONS

International Search Report dated Apr. 28, 2015 in PCT/JP2015/056097, filed on Mar. 2, 2015 (with English translation).
(Continued)

*Primary Examiner* — Matthew C Landau
*Assistant Examiner* — Mark Hatzilambrou
(74) *Attorney, Agent, or Firm* — Oblon, McClelland, Maier & Neustadt, L.L.P.

(57) ABSTRACT

A semiconductor memory device according to an embodiment, includes a semiconductor pillar extending in a first direction, a first electrode extending in a second direction crossing the first direction, a second electrode provided between the semiconductor pillar and the first electrode, a first insulating film provided between the first electrode and the second electrode and on two first-direction sides of the first electrode, a second insulating film provided between the second electrode and the first insulating film and on two first-direction sides of the second electrode, a third insulating film provided between the second electrode and the semiconductor pillar, and a conductive film provided inside a region interposed between the first insulating film and the second insulating film.

11 Claims, 24 Drawing Sheets

(51) Int. Cl.
*H01L 29/423* (2006.01)
*H01L 29/51* (2006.01)
*H01L 29/66* (2006.01)

(52) U.S. Cl.
CPC .......... *H01L 29/512* (2013.01); *H01L 29/517* (2013.01); *H01L 29/66825* (2013.01)

(56) References Cited

U.S. PATENT DOCUMENTS

| | | |
|---|---|---|
| 2011/0024816 A1 | 2/2011 | Moon et al. |
| 2011/0032772 A1 | 2/2011 | Aritome |
| 2011/0121381 A1 | 5/2011 | Kanemura et al. |
| 2011/0140068 A1* | 6/2011 | Ozawa .................. H01L 27/249 257/4 |
| 2012/0217564 A1 | 8/2012 | Tang et al. |
| 2013/0221423 A1 | 8/2013 | Kawasaki et al. |
| 2014/0084356 A1 | 3/2014 | Aoki et al. |
| 2014/0131784 A1 | 5/2014 | Davis et al. |
| 2014/0131785 A1 | 5/2014 | Seo et al. |
| 2014/0175530 A1 | 6/2014 | Chien et al. |
| 2015/0364485 A1* | 12/2015 | Shimura ............. H01L 27/1157 257/316 |
| 2015/0380422 A1* | 12/2015 | Sharangpani ..... H01L 27/11556 365/185.17 |

FOREIGN PATENT DOCUMENTS

| | | |
|---|---|---|
| JP | 2012-94694 | 5/2012 |
| JP | 2013-182949 | 9/2013 |
| JP | 2014-63883 | 4/2014 |
| JP | 2014-509454 | 4/2014 |
| JP | 2014-96466 | 5/2014 |
| TW | 201428895 A | 7/2014 |
| WO | WO 2006/132158 A1 | 12/2006 |
| WO | WO 2016/135849 A1 | 9/2016 |

OTHER PUBLICATIONS

Written Opinion dated Apr. 28, 2015 in PCT/JP2015/056097, filed on Mar. 2, 2015.

* cited by examiner

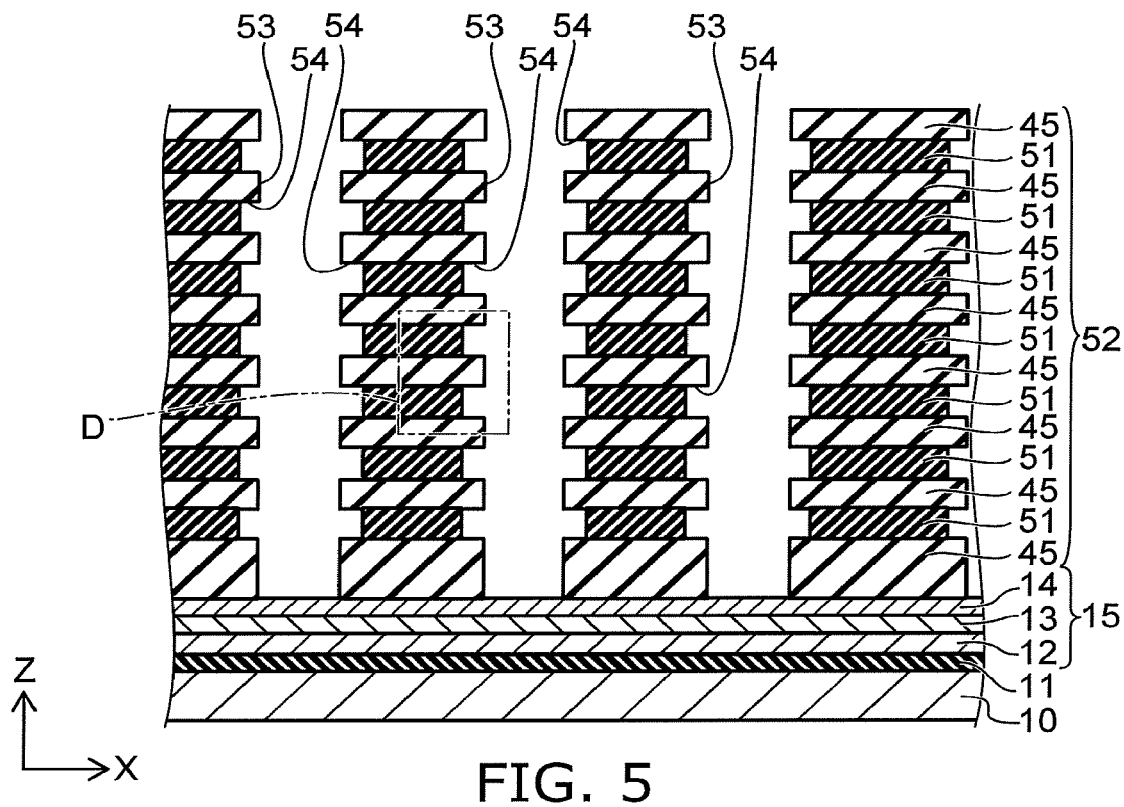
FIG. 5
FIG. 6
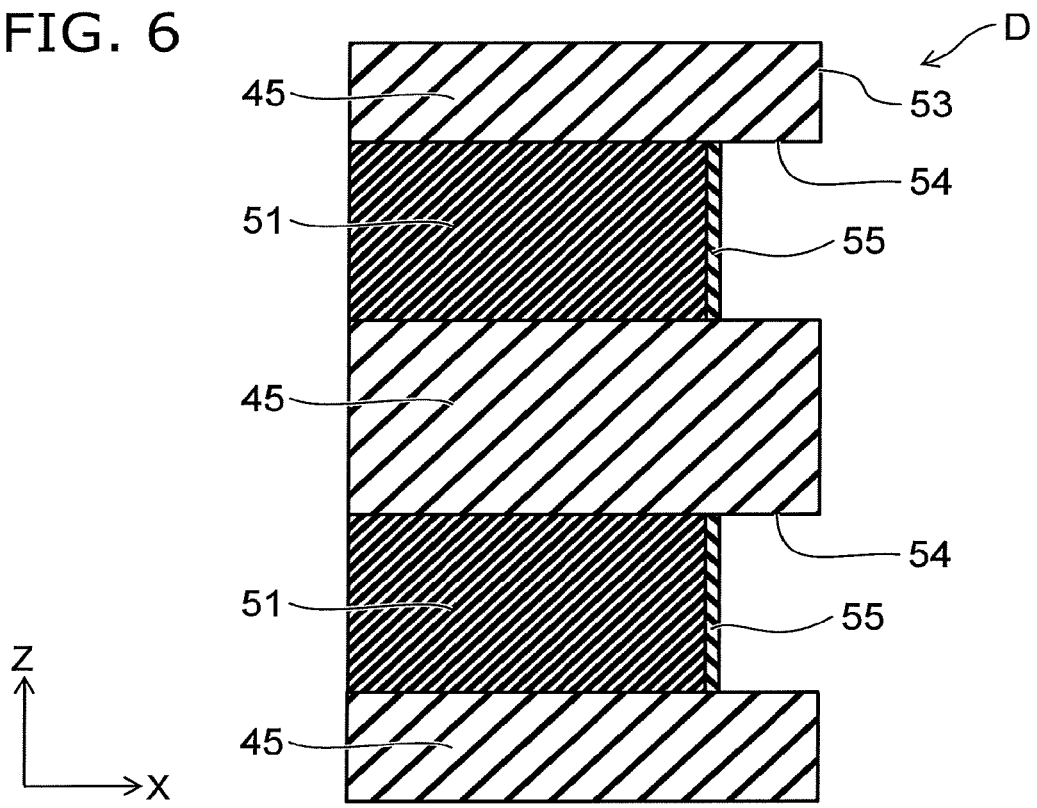

SEMICONDUCTOR MEMORY DEVICE AND METHOD FOR MANUFACTURING SAME

CROSS-REFERENCE TO RELATED APPLICATION

This is a continuation application of International Application PCT/JP2015/056097, filed on Mar. 2, 2015; the entire contents of which are incorporated herein by reference.

FIELD

Embodiments relate to a semiconductor memory device and a method for manufacturing the same.

BACKGROUND

Conventionally, in NAND flash memory, the bit cost has been reduced by increasing the integration by downscaling the planar structure; but the downscaling of the planar structure is approaching a limit. Therefore, in recent years, technology has been proposed to stack the memory cells in the vertical direction. However, the ease of manufacturing and the reliability of the product are challenges for such a stacked type memory device.

BRIEF DESCRIPTION OF THE DRAWINGS

FIG. 3 to FIG. 17B are cross-sectional views showing a method for manufacturing the semiconductor memory device according to the first embodiment;

DETAILED DESCRIPTION

Figure 1A:
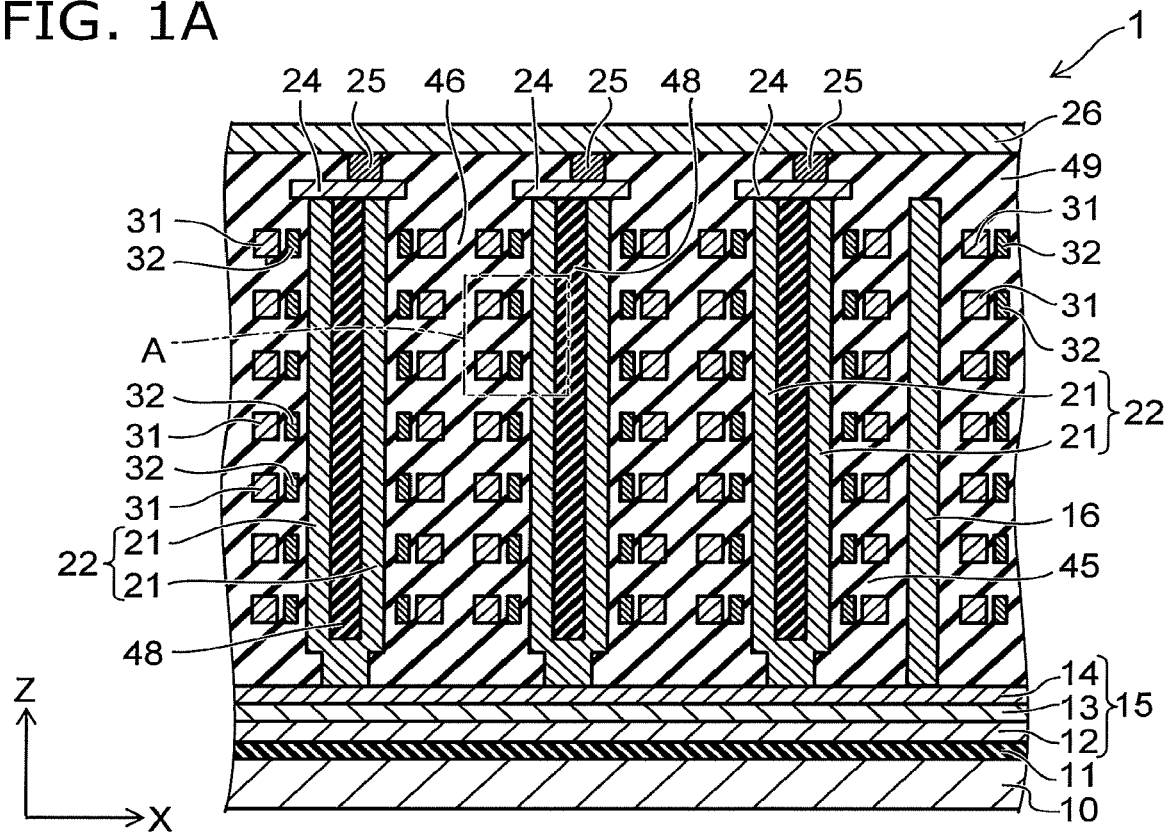
FIG. 1A is a cross-sectional view showing a semiconductor memory device according to a first embodiment.

A semiconductor memory device according to an embodiment, includes a semiconductor pillar extending in a first direction, a first electrode extending in a second direction crossing the first direction, a second electrode provided between the semiconductor pillar and the first electrode, a first insulating film provided between the first electrode and the second electrode and on two first-direction sides of the first electrode, a second insulating film provided between the second electrode and the first insulating film and on two first-direction sides of the second electrode, a third insulating film provided between the second electrode and the semiconductor pillar, and a conductive film provided inside a region interposed between the first insulating film and the second insulating film.

A method for manufacturing a semiconductor memory device according to an embodiment, includes stacking an inter-layer insulating film and a first film alternately along a first direction. The method includes forming a trench extending in a second direction and piercing the inter-layer insulating film and the first film. The second direction crosses the first direction. The method includes forming a first recess in a side surface of the trench by removing a portion of the first film via the trench. The method includes forming a second insulating film on an inner surface of the first recess, a composition of the second insulating film being different from a composition of the inter-layer insulating film. The method includes forming a second electrode film on the second insulating film. The method includes forming a third insulating film on an inner surface of the trench. The method includes forming a semiconductor film on a side surface of the third insulating film. The method includes dividing the semiconductor film, the third insulating film, the second electrode film, and the second insulating film along the second direction. The method includes filling an insulating member into the trench. A composition of the insulating member is different from a composition of the second insulating film. The method includes forming a slit extending in the second direction and piercing the inter-layer insulating film and the first film. The method includes forming a second recess in a side surface of the slit by removing the first film via the slit. The second insulating film and the insulating member are exposed at a back surface of the second recess. The method includes forming a deposition-inhibiting layer at a region of an inner surface of the second recess and the slit other than an exposed surface of the second insulating film. The method includes forming a conductive film on the exposed surface of the second insulating film by performing vapor deposition using a source gas via the slit and the second recess. The method includes forming a first insulating film on the inner surface of the second recess. The method includes forming a first electrode inside the second recess.

A method for manufacturing a semiconductor memory device according to an embodiment, includes stacking an inter-layer insulating film and a first film alternately along a first direction. The method includes forming a trench extending in a second direction and piercing the inter-layer insulating film and the first film. The second direction crosses the first direction. The method includes forming a first recess in a side surface of the trench by removing a portion of the first film via the trench. The method includes forming a silicon layer including silicon on an inner surface of the first recess. The method includes forming a second insulating film on the silicon layer. The method includes forming a second electrode film on the second insulating film. The method includes forming a third insulating film on an inner surface of the trench. The method includes forming a semiconductor film on a side surface of the third insulating film. The method includes dividing the semiconductor film, the third insulating film, the second electrode film, and the second insulating film along the second direction. The method includes filling an insulating member into the trench. The method includes forming a slit extending in the second direction and piercing the inter-layer insulating film and the first film. The method includes forming a second recess in a side surface of the slit by removing the first film via the slit. The silicon layer and the insulating member are exposed at a back surface of the second recess. The method includes forming a metal layer on an inner surface of the second recess. The method includes forming a conductive film including a metal silicide by causing the silicon included in the silicon layer and the metal included in the metal layer to react. The method includes removing the metal layer on the inner surface of the second recess. The method includes forming a first insulating film on the inner surface of the second recess. The method includes forming a first electrode inside the second recess.

First Embodiment

First, a first embodiment will be described.

Figure 1B:
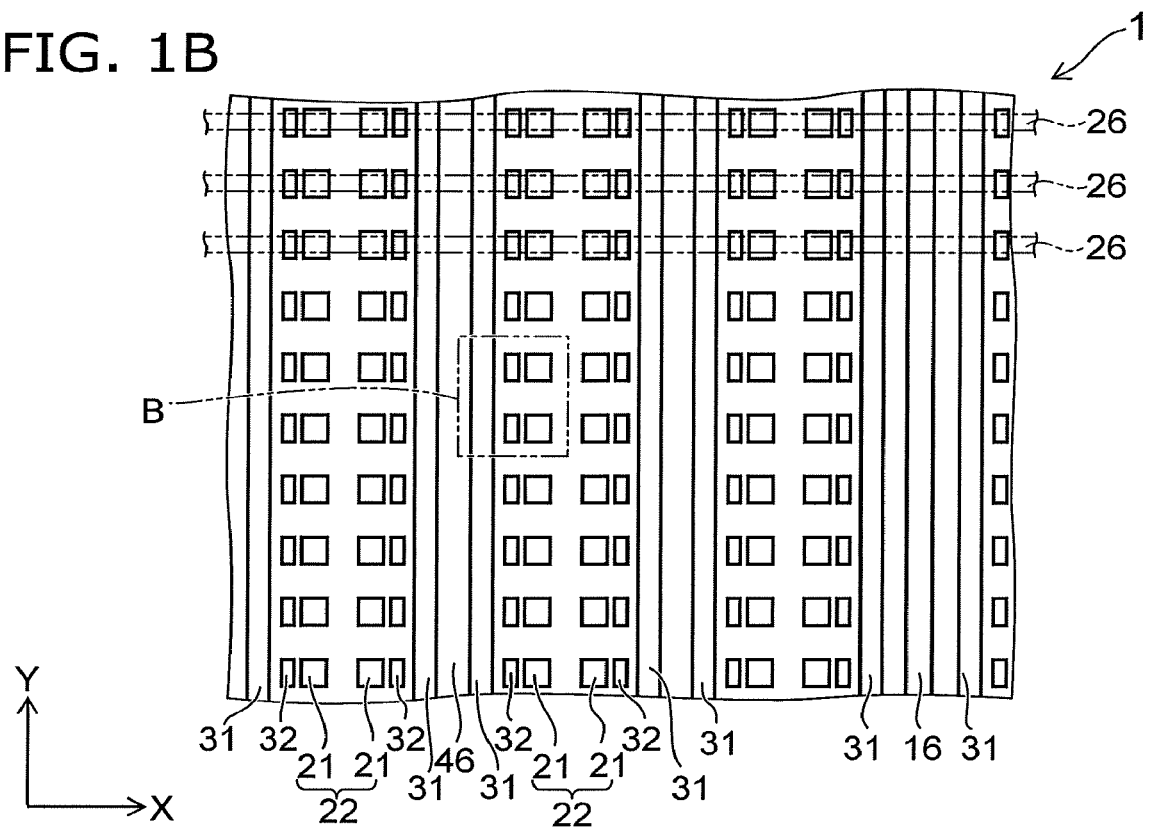
FIG. 1B is a plan view thereof.

FIG. 1A is a cross-sectional view showing a semiconductor memory device according to the embodiment; and FIG. 1B is a plan view of the semiconductor memory device according to the embodiment.

Figure 2A:
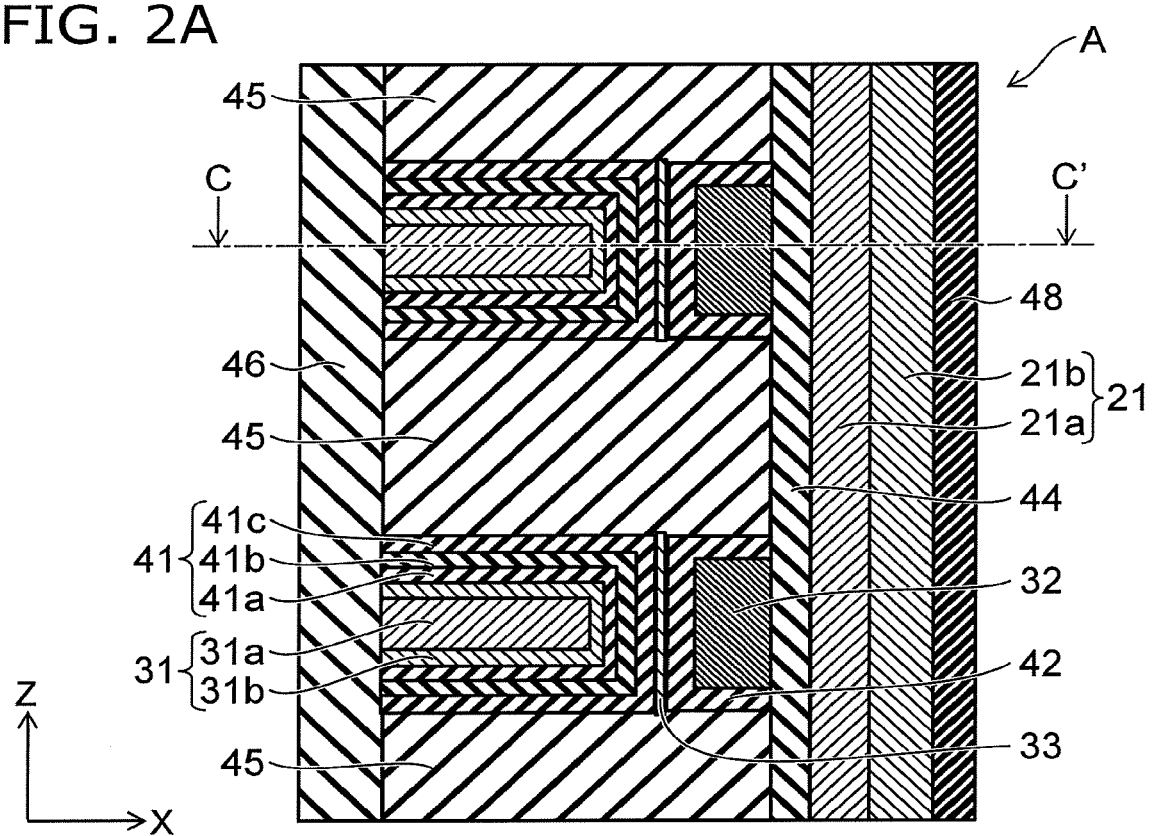
FIG. 2A and FIG. 2B are partially enlarged cross-sectional views showing the semiconductor memory device according to the first embodiment.
Figure 2B:
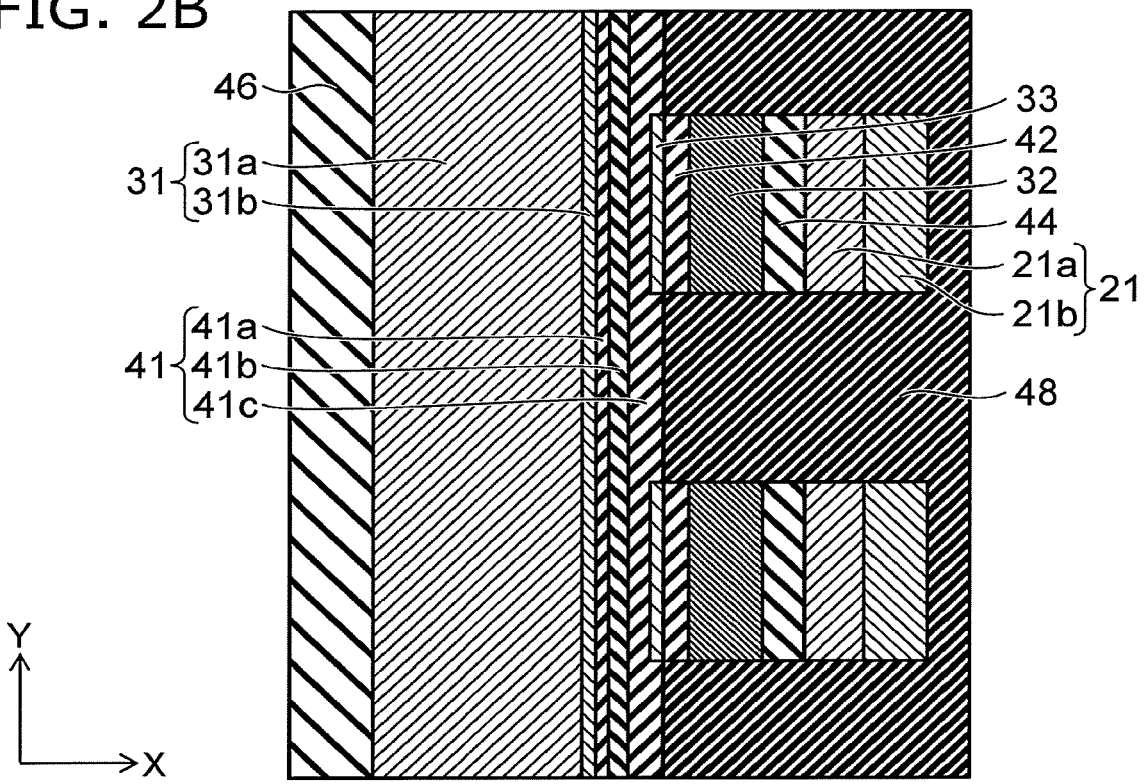

FIG. 2A and FIG. 2B are partially enlarged cross-sectional views showing the semiconductor memory device according to the embodiment.

FIG. 2A shows region A of FIG. 1A; FIG. 2B shows region B of FIG. 1B; and FIG. 2B shows the cross section along line C-C' shown in FIG. 2A.

First, a schematic configuration of the semiconductor memory device 1 according to the embodiment will be described.

As shown in FIG. 1A and FIG. 1B, a silicon substrate 10 is provided in the semiconductor memory device 1. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface is taken as a "Z-direction."

An insulating film 11 made of, for example, silicon oxide, a conductive layer 12 made of, for example, polysilicon, an interconnect layer 13 made of, for example, tungsten, and a conductive layer 14 made of, for example, polysilicon are stacked in this order on the silicon substrate 10. A cell source line 15 is formed of the conductive layer 12, the interconnect layer 13, and the conductive layer 14. The cell source line 15 spreads along the XY plane.

Multiple silicon pillars 21 that extend in the Z-direction are provided on the cell source line 15. The silicon pillars 21 are arranged in a matrix configuration along the X-direction and the Y-direction. The lower end portions of two silicon pillars 21 adjacent to each other in the X-direction are connected to each other; and the lower end portions are connected to the cell source line 15. Hereinbelow, the two silicon pillars 21 of which the lower end portions are connected to each other are called a "pillar pair 22."

A connection member 24 that has the X-direction as the longitudinal direction is provided on the pillar pair 22 and is connected to the upper end portion of the pillar pair 22. A plug 25 is provided on the connection member 24; and multiple bit lines 26 that extend in the X-direction are provided on the plugs 25. For example, the connection members 24, the plugs 25, and the bit lines 26 are formed of tungsten (W). Each of the bit lines 26 is connected via the plugs 25 and the connection members 24 to the multiple silicon pillars 21 arranged in one column along the X-direction. Therefore, each of the silicon pillars 21 is connected between the bit line 26 and the cell source line 15.

Because FIG. 1A and FIG. 1B are drawings showing the general concept of the device, several conductive members are mainly drawn schematically; and the other portions are drawn as being simplified. For example, a conductive film 33 that is described below also is not illustrated. Further, the plugs 25 and the connection members 24 also are not illustrated in FIG. 1B. Further, in FIG. 1B, only some of the bit lines 26 are shown by double dot-dash lines; and the remaining bit lines 26 are not illustrated.

Also, multiple control gate electrodes 31 that extend in the Y-direction are provided on the cell source line 15. As described below, the control gate electrodes 31 are formed of a metal such as tungsten, etc. The control gate electrodes 31 are arranged in one column along the Z-direction on each of the two X-direction sides of the pillar pairs 22 arranged in one column along the Y-direction. Also, one unit includes the multiple pairs of pillar pairs 22 arranged in one column along the Y-direction and the multiple control gate electrodes 31 arranged in one column along the Z-direction on each of the two X-direction sides of the multiple pairs of pillar pairs 22. In other words, the two control gate electrodes 31 and the two silicon pillars 21 included in the pillar pair 22 are arranged alternately along the X-direction. One source electrode 16 is provided every several units. The configuration of the source electrode 16 is a sheet configuration spreading along the YZ plane and is disposed between two mutually-adjacent units. The lower end of the source electrode 16 is connected to the cell source line 15.

A floating gate electrode 32 is provided between each of the silicon pillars 21 and each of the control gate electrodes 31. The floating gate electrode 32 is insulated from the periphery, is a conductive member that stores charge, and is formed of, for example, polysilicon (Si). The floating gate electrode 32 is disposed at each crossing portion between the silicon pillars 21 and the control gate electrodes 31. In other words, the multiple floating gate electrodes 32 are arranged in a matrix configuration separated from each other along the Y-direction and the Z-direction between a column of the silicon pillars 21 arranged in one column along the Y-direction and a column of the control gate electrodes 31 arranged in one column along the Z-direction. Because the silicon pillars 21 and the control gate electrodes 31 are arranged also along the X-direction, the floating gate electrodes 32 are arranged in a three-dimensional matrix configuration along the X-direction, the Y-direction, and the Z-direction. Also, as described below, an insulating material is filled between the source electrodes 16, the silicon pillars 21, the control gate electrodes 31, the floating gate electrodes 32, and the bit lines 26.

The configuration of the periphery of the crossing portion between each of the silicon pillars 21 and each of the control gate electrodes 31 of the semiconductor memory device 1 will now be described in detail.

As shown in FIG. 2A and FIG. 2B, a main portion 31a that is made of, for example, tungsten and a barrier metal layer 31b that is made of, for example, titanium nitride (TiN) are provided in the control gate electrode 31. The configuration of the main portion 31a is a band configuration extending in the Y-direction. The barrier metal layer 31b covers the side surface of the main portion 31a on the floating gate electrode 32 side, the upper surface of the main portion 31a, and the lower surface of the main portion 31a.

Also, a blocking insulating film 41 is provided on the side surface of the control gate electrode 31 on the floating gate electrode 32 side, on the upper surface of the control gate electrode 31, and on the lower surface of the control gate electrode 31. The configuration of the blocking insulating film 41 in the XZ cross section is a C-shaped configuration. The blocking insulating film 41 is a film in which a current substantially does not flow even when a voltage within the range of the drive voltage of the semiconductor memory device 1 is applied and is, for example, a high dielectric constant film in which the dielectric constant of the entirety is higher than the dielectric constant of silicon oxide. A hafnium oxide layer 41a that is made of hafnium oxide (HfO$_2$), a silicon oxide layer 41b that is made of silicon oxide (SiO$_2$), and a hafnium silicon oxide layer 41c that is made of hafnium silicon oxide (HfSiO) are stacked in order from the control gate electrode 31 side in the blocking insulating film 41.

On the other hand, an inter-electrode insulating film 42 made of silicon nitride (Si$_3$N$_4$) is provided on the side surface of the floating gate electrode 32 on the control gate electrode 31 side, on the upper surface of the floating gate electrode 32, and on the lower surface of the floating gate electrode 32. The configuration of the inter-electrode insulating film 42 in the XZ cross section is a C-shaped configuration having the reverse orientation of the most proximal blocking insulating film 41. Also, the conductive film 33 that is made of, for example, titanium nitride (TiN) is provided between the hafnium silicon oxide layer 41c and the inter-electrode insulating film 42. The conductive film 33 is provided every floating gate electrode 32 but substantially does not extend around onto the upper surface and the lower surface of the control gate electrode 31 or onto the upper surface and the lower surface of the floating gate electrode 32. Therefore, the configuration of the conductive film 33 in the XZ cross section is a line-shaped configuration. Also, the conductive film 33 is insulated from the periphery.

A tunneling insulating film 44 that has a band configuration extending in the Z-direction and has the Y-direction as the width direction is provided every silicon pillar 21 between the silicon pillar 21 and the floating gate electrodes 32. The tunneling insulating film 44 is a film in which a tunneling current flows when a prescribed voltage within the range of the drive voltage of the semiconductor memory device 1 is applied and is, for example, a single-layer silicon oxide film or a three-layer film made of a silicon oxide layer, a silicon nitride layer, and a silicon oxide layer. The average dielectric constant of the entire tunneling insulating film 44 is lower than the average dielectric constant of the entire blocking insulating film 41.

A silicon layer 21a and a silicon layer 21b are stacked in the silicon pillar 21 in contact with each other. The silicon layer 21a is disposed on the side proximal to the floating gate electrodes 32; and the lower end of the silicon layer 21a does not contact the cell source line 15. The silicon layer 21b is disposed on the side distal to the floating gate electrodes 32; and the lower end of the silicon layer 21b contacts the cell source line 15.

An inter-layer insulating film 45 that is made of, for example, silicon oxide and has a band configuration extending in the Y-direction is provided between the blocking insulating films 41 adjacent to each other in the Z-direction and between the inter-electrode insulating films 42 adjacent to each other in the Z-direction. The inter-layer insulating film 45 contacts the blocking insulating film 41, the conductive film 33, and the inter-electrode insulating film 42. Also, an insulating member 46 that is made of, for example, silicon oxide and has a sheet configuration spreading along the YZ plane is provided in the space where the silicon pillar 21 is not provided between the control gate electrodes 31 adjacent to each other in the X-direction, between the blocking insulating films 41 adjacent to each other in the X-direction, and between the inter-layer insulating films 45 adjacent to each other in the X-direction. Further, an insulating member 48 that is made of, for example, silicon oxide is provided to surround the stacked body made of the tunneling insulating film 44 and the silicon pillar 21. A portion of the insulating member 48 is disposed between the two silicon pillars 21 included in the pillar pair 22; and another portion is disposed between the floating gate electrodes 32 adjacent to each other in the Y-direction.

In the semiconductor memory device 1, a transistor that includes one floating gate electrode 32 and one conductive film 33 is formed at each crossing portion between the silicon pillars and the control gate electrodes 31; and this transistor functions as a memory cell. Also, a NAND string in which the multiple memory cells are connected in series is connected between the bit line 26 and the cell source line 15.

A method for manufacturing the semiconductor memory device according to the embodiment will now be described.

FIG. 3 to FIG. 10 are cross-sectional views showing the method for manufacturing the semiconductor memory device according to the embodiment.

Figure 11A:
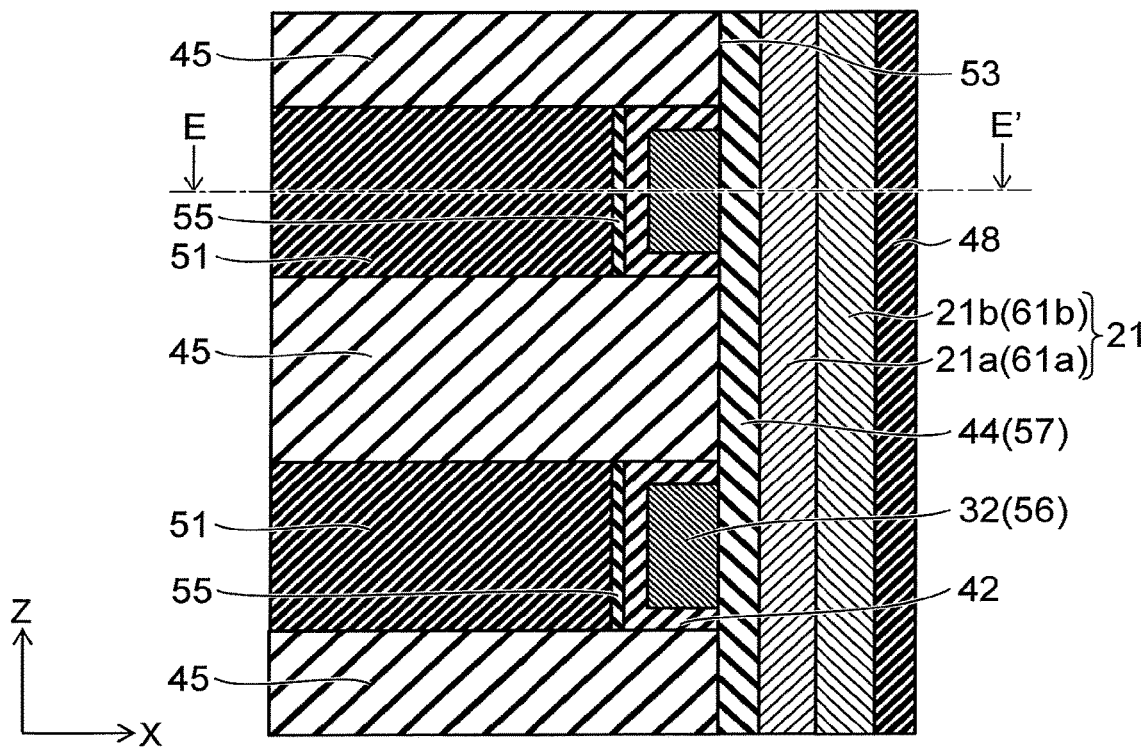
Figure 11B:
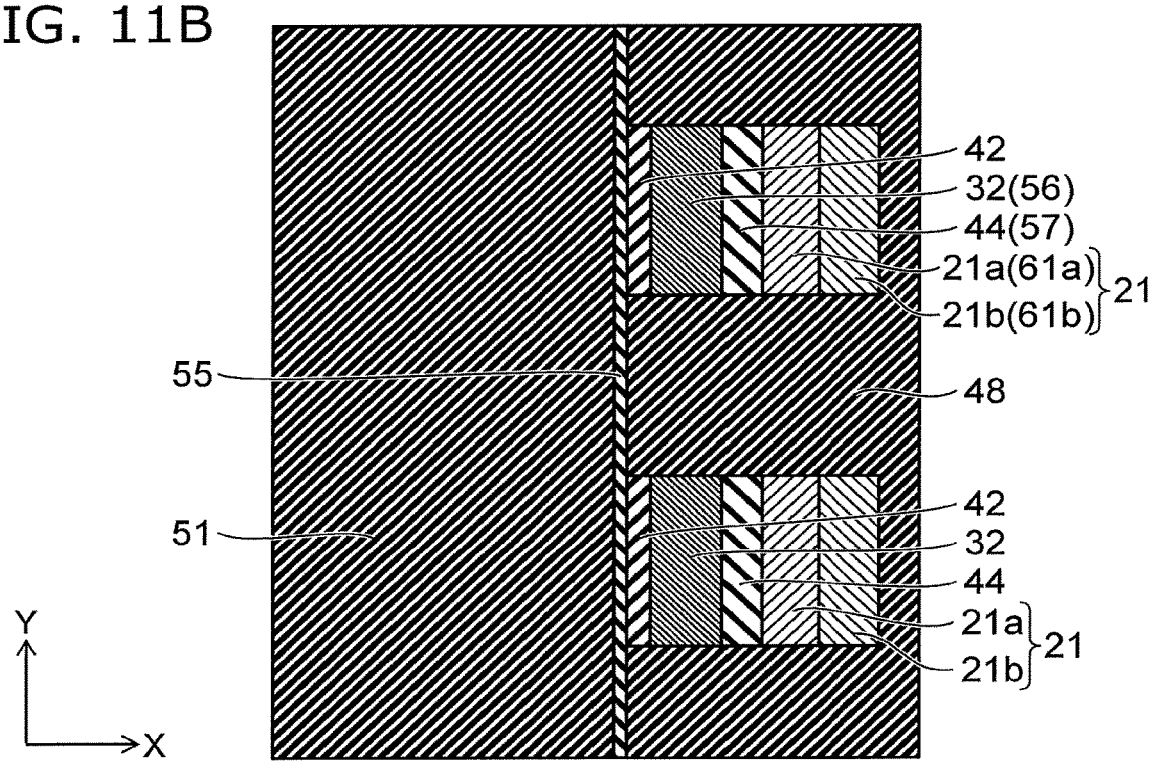

FIG. 11A and FIG. 11B are cross-sectional views showing the method for manufacturing the semiconductor memory device according to the embodiment.

FIG. 11A shows a region corresponding to region A of FIG. 1A; FIG. 11B shows a region corresponding to region B of FIG. 1B; and FIG. 11B shows a cross section along line E-E' shown in FIG. 11A.

Figure 12:
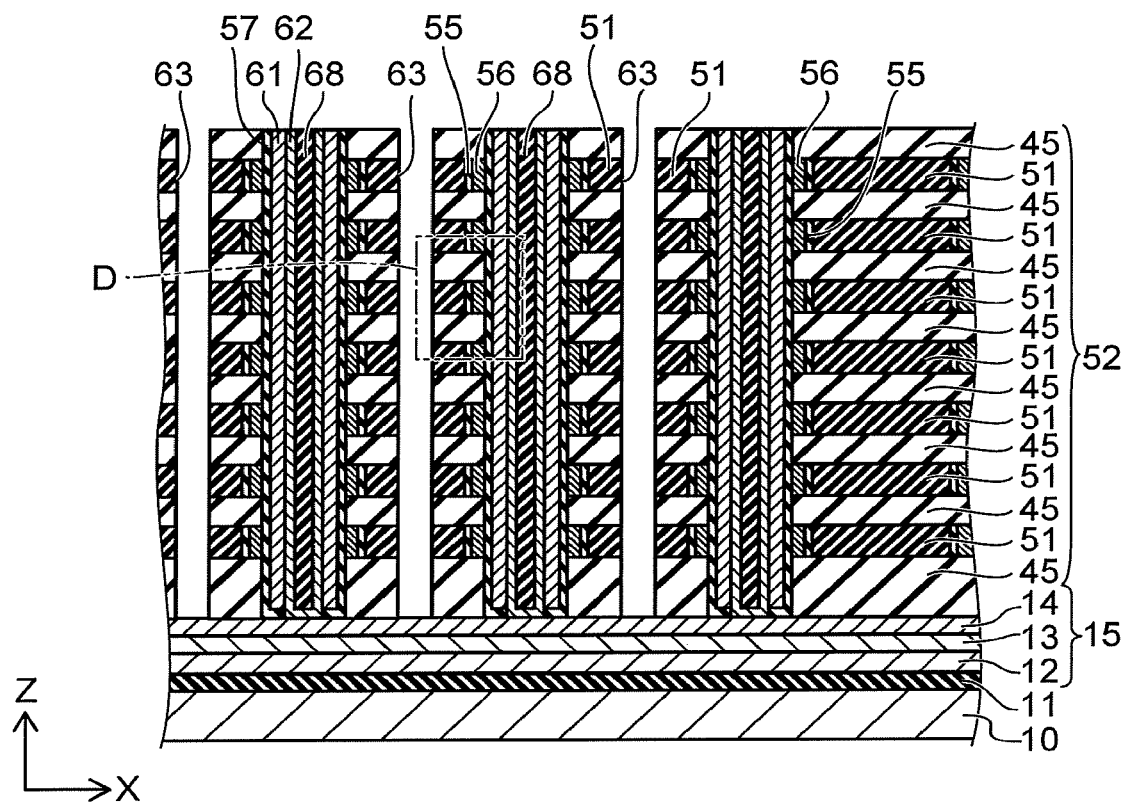

FIG. 12 is a cross-sectional view showing the method for manufacturing the semiconductor memory device according to the embodiment.

FIG. 13A, FIG. 13B to FIG. 17A, and FIG. 17B are cross-sectional views showing the method for manufacturing the semiconductor memory device according to the embodiment.

Figure 13A:
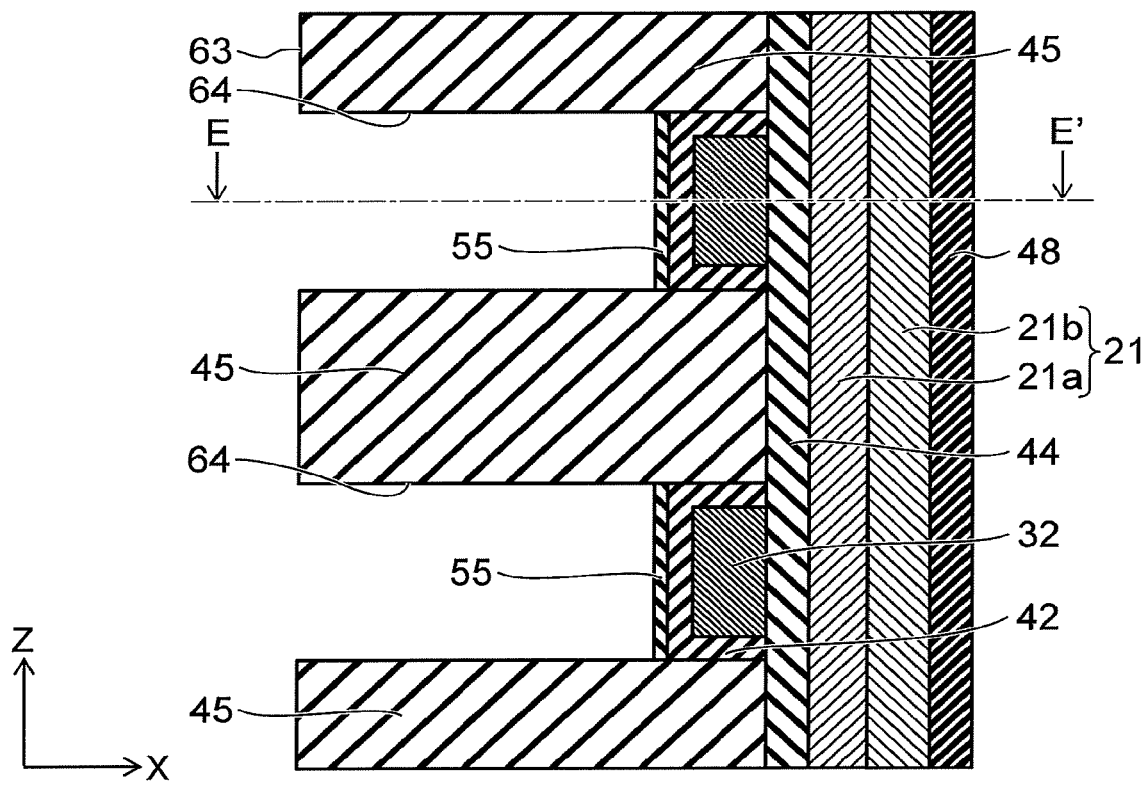
Figure 13B:
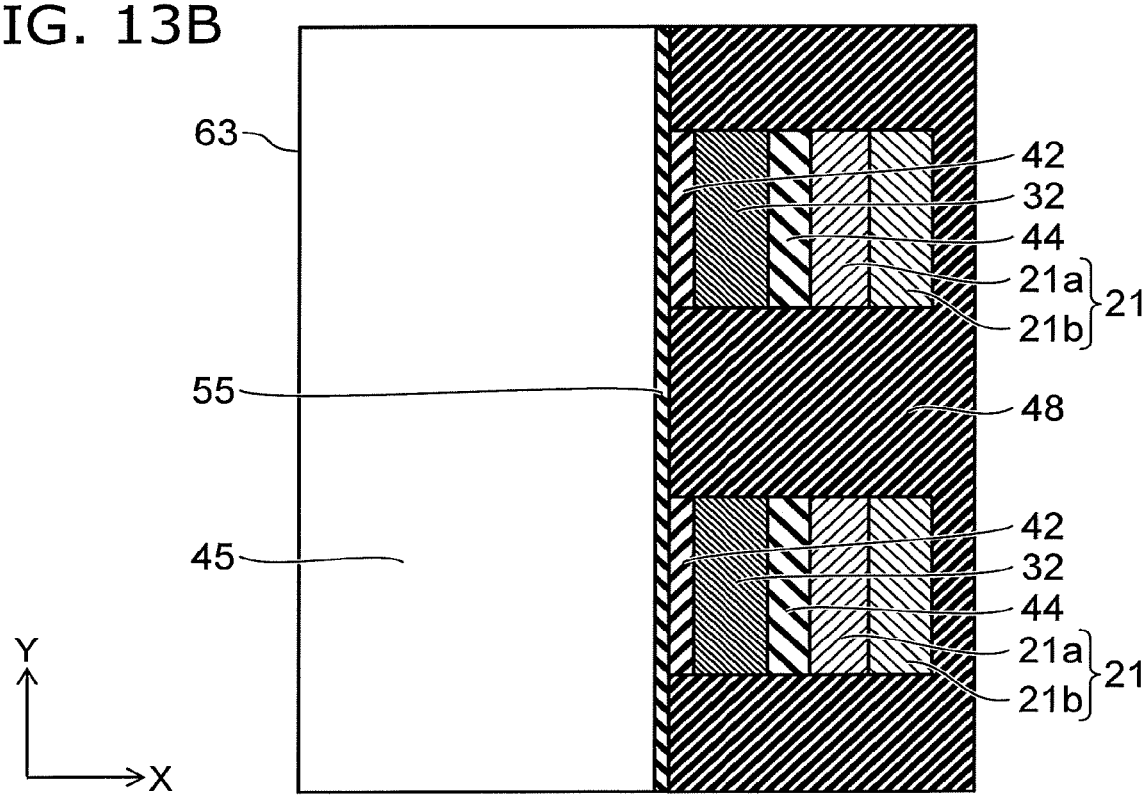

FIG. 13A shows a region corresponding to region D of FIG. 12; and FIG. 13B shows a cross section along line E-E' shown in FIG. 13A. This is similar for FIG. 14A to FIG. 17B as well.

Figure 3:
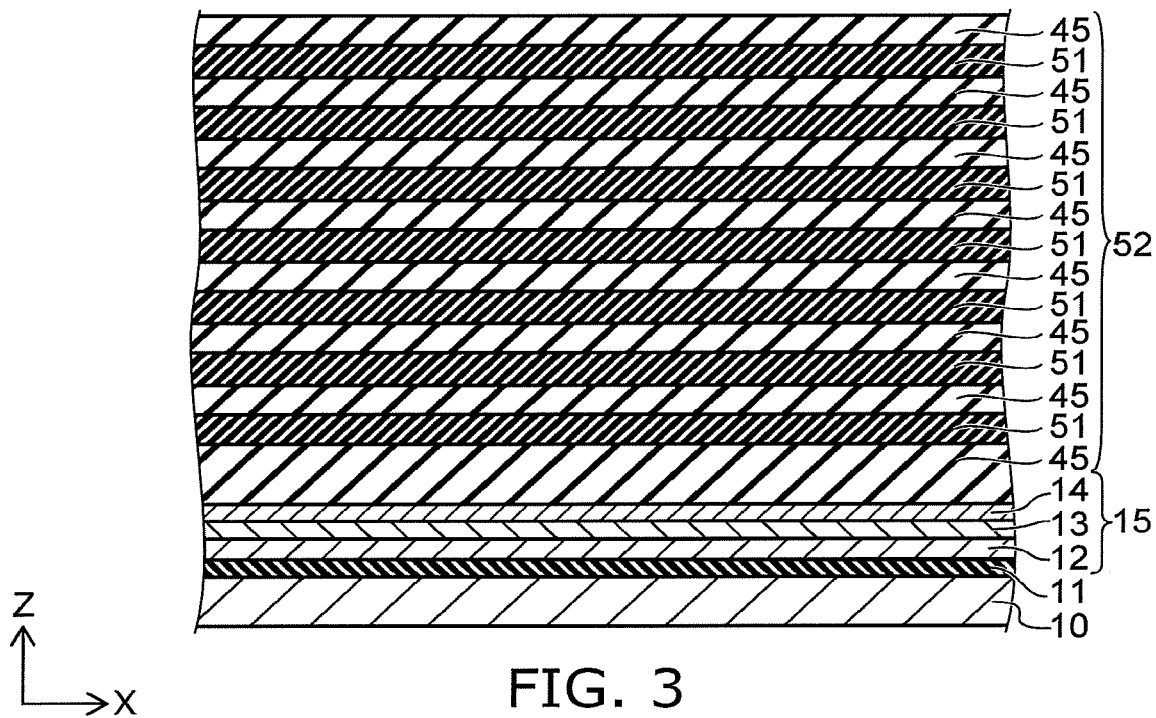

First, the silicon substrate 10 is prepared as shown in FIG. 3.

Then, the insulating film 11, the conductive layer 12, the interconnect layer 13, and the conductive layer 14 are formed in this order on the silicon substrate 10. The cell source line 15 is formed of the conductive layer 12, the interconnect layer 13, and the conductive layer 14.

Then, a stacked body 52 is formed by alternately stacking the inter-layer insulating films 45 made of, for example, silicon oxide and sacrificial films 51 made of, for example, silicon nitride on the cell source line 15.

Figure 4:
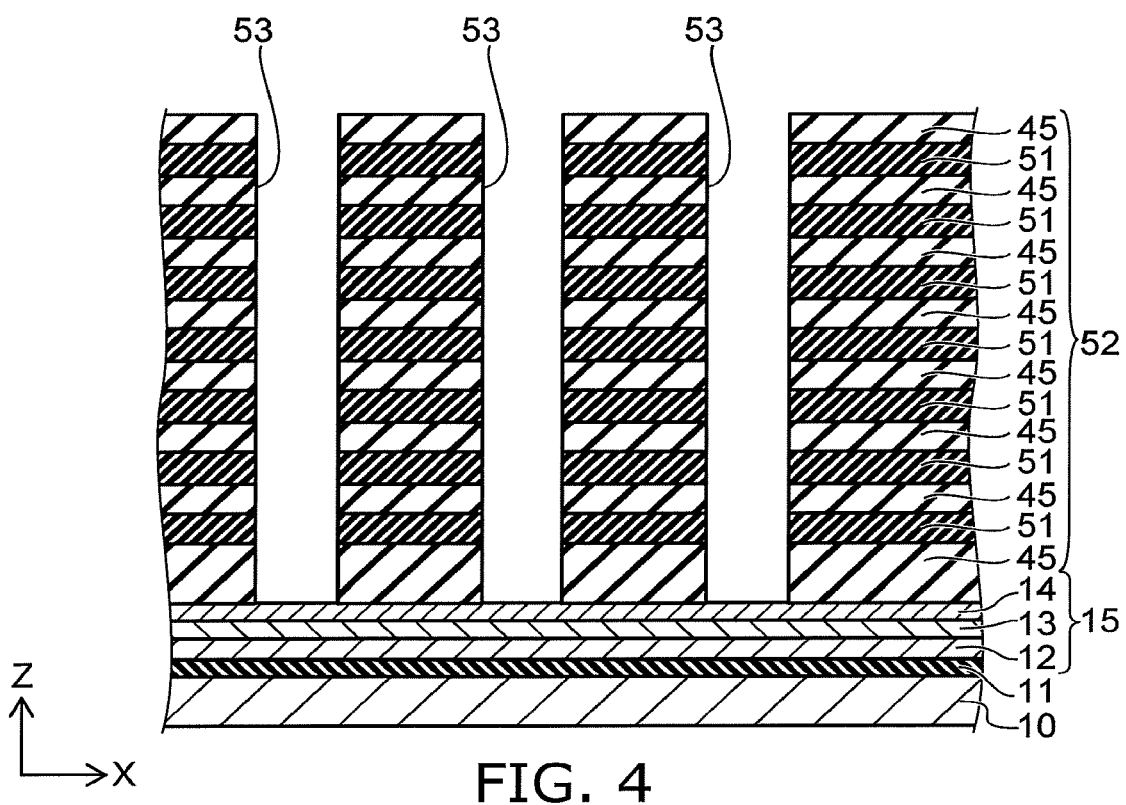

Then, as shown in FIG. 4, a memory trench 53 that extends in the Y-direction is multiply formed in the stacked body 52. The memory trenches 53 pierce the stacked body 52; and the cell source line 15 is exposed at the bottom surfaces of the memory trenches 53.

Then, as shown in FIG. 5, isotropic etching of the sacrificial films 51 is performed via the memory trenches 53. For example, wet etching using hot phosphoric acid as the etchant is performed. Thereby, a portion of the sacrificial films 51 is removed; and the exposed regions of the sacrificial films 51 recede at the side surfaces of the memory trenches 53. As a result, recesses 54 that extend in the Y-direction are formed in the side surfaces of the memory trenches 53. FIG. 6 to FIG. 10 described below show a region corresponding to region D of FIG. 5.

Then, as shown in FIG. 6, a stopper layer 55 that is made of silicon oxide is formed on the exposed surfaces of the sacrificial films 51 inside the recesses 54 by performing, for example, thermal oxidation treatment. The stopper layer 55 may be formed by depositing silicon oxide using CVD (chemical vapor deposition), etc.

Figure 7:
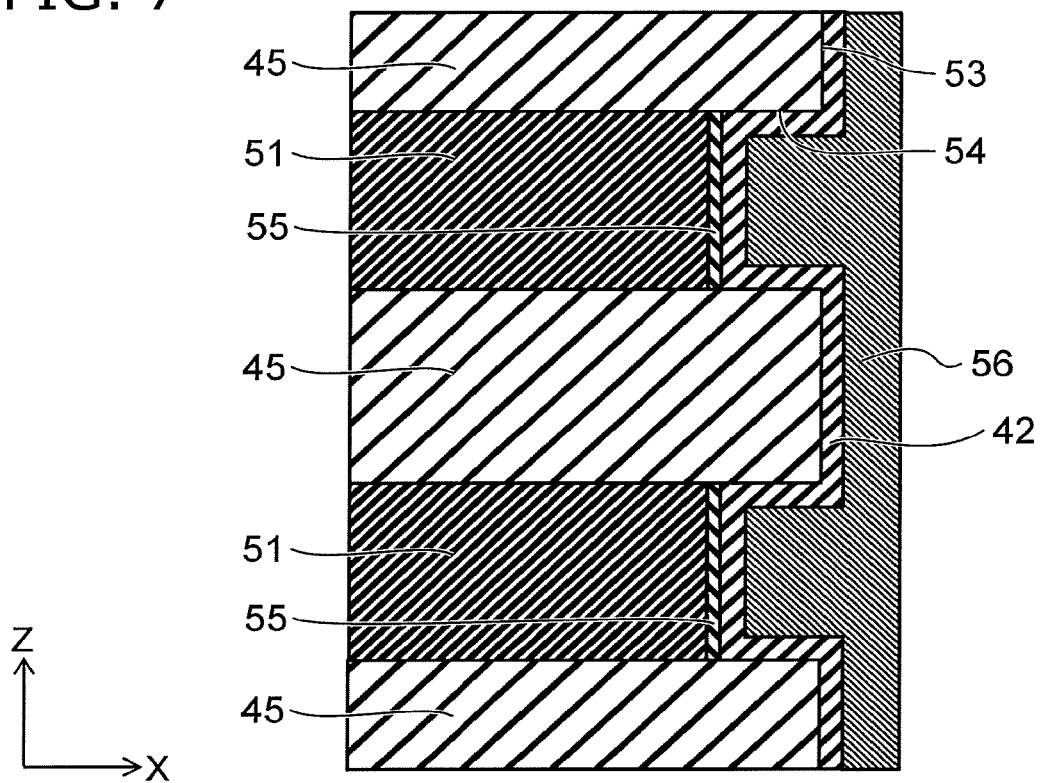

Then, as shown in FIG. 7, the inter-electrode insulating film 42 is formed in the memory trench 53 and on the inner surfaces of the recesses 54 by depositing, for example, silicon nitride. Then, a silicon film 56 is formed on the inner surface of the memory trench 53 by depositing amorphous silicon using CVD, etc. The silicon film 56 is filled also into the recesses 54.

Figure 8:
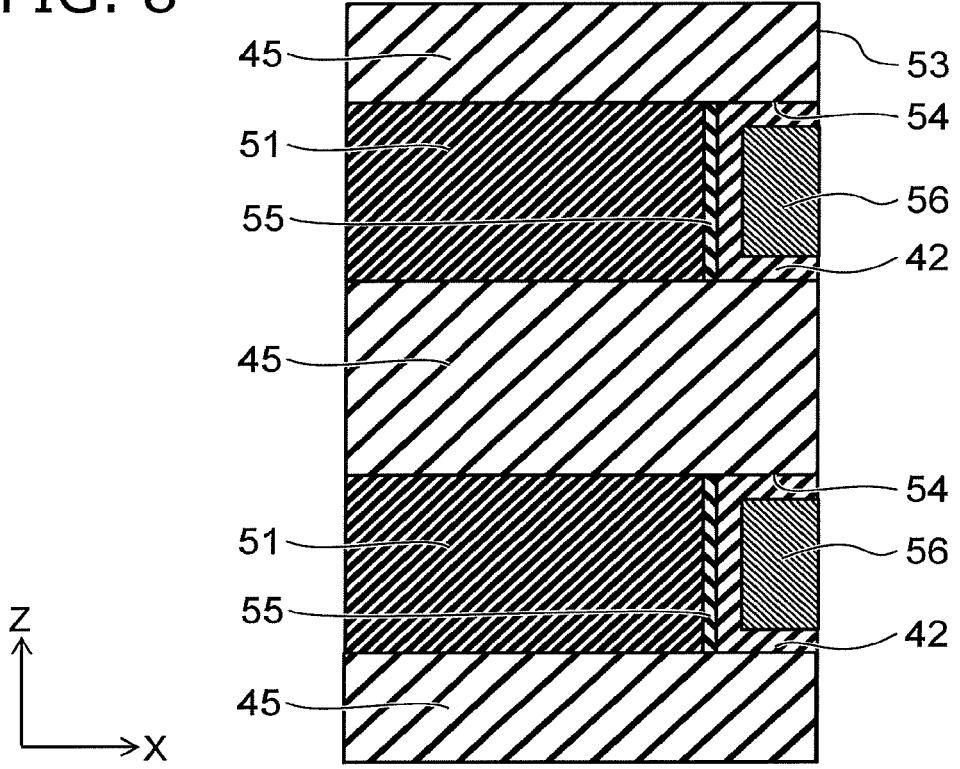

Then, as shown in FIG. 8, etch-back of the silicon film 56 is performed; the portion of the silicon film 56 disposed inside the recesses 54 is caused to remain; and the portion of the silicon film 56 disposed outside the recesses 54 is removed. Then, etch-back of the inter-electrode insulating film 42 is performed; the portion of the inter-electrode insulating film 42 disposed inside the recesses 54 is caused to remain; and the portion of the inter-electrode insulating film 42 disposed outside the recesses 54 is removed. Thereby, the silicon film 56 and the inter-electrode insulating film 42 are divided every sacrificial film 51 in the Z-direction.

Figure 9:
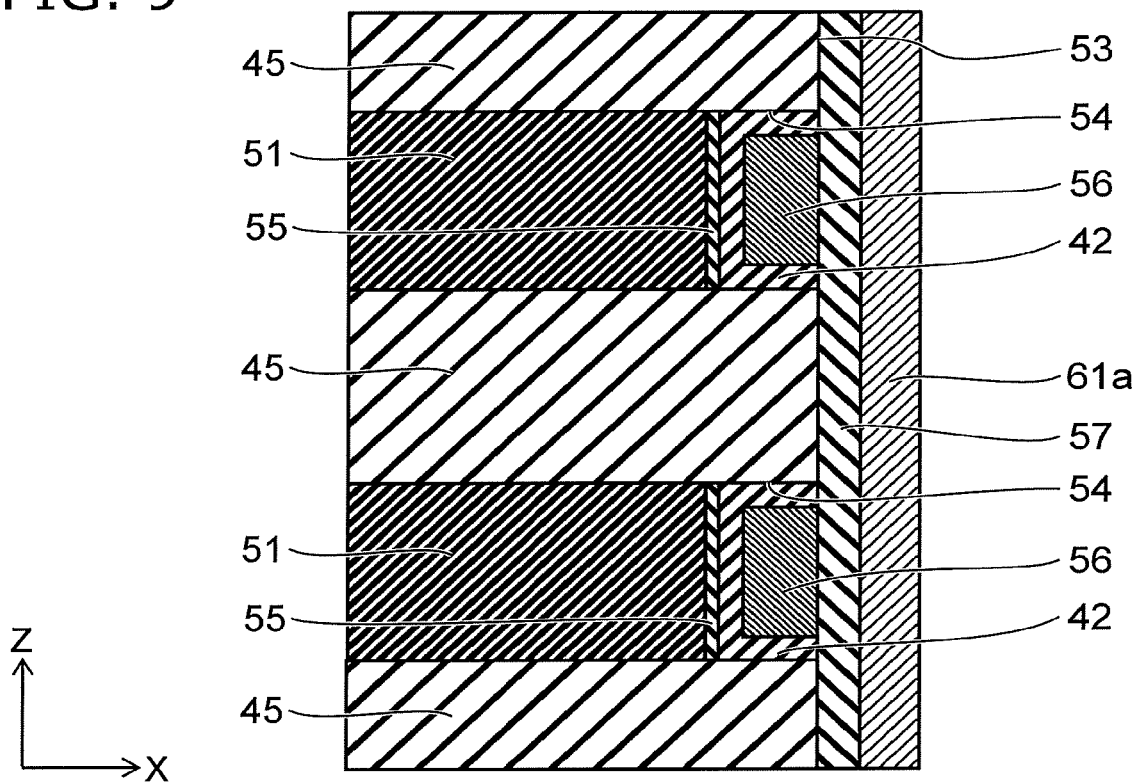

Then, as shown in FIG. 9, a silicon oxide film 57 is formed on the inner surface of the memory trench 53 by depositing silicon oxide using, for example, CVD, etc. Then, a silicon layer 61a is formed on the silicon oxide film 57 by depositing amorphous silicon using CVD, etc. At this time, the silicon layer 61a does not fill the entire memory trench 53.

Then, anisotropic etching such as RIE (Reactive Ion Etching), etc., of the silicon layer 61a and the silicon oxide film 57 is performed. Thereby, the silicon layer 61a and the silicon oxide film 57 that are on the bottom surface of the memory trench 53 are removed; and the cell source line 15 is exposed. At this time, damage due to the anisotropic etching does not occur easily because the portion of the silicon oxide film 57 disposed on the side surface of the memory trench 53 is protected by the silicon layer 61a.

Figure 10:
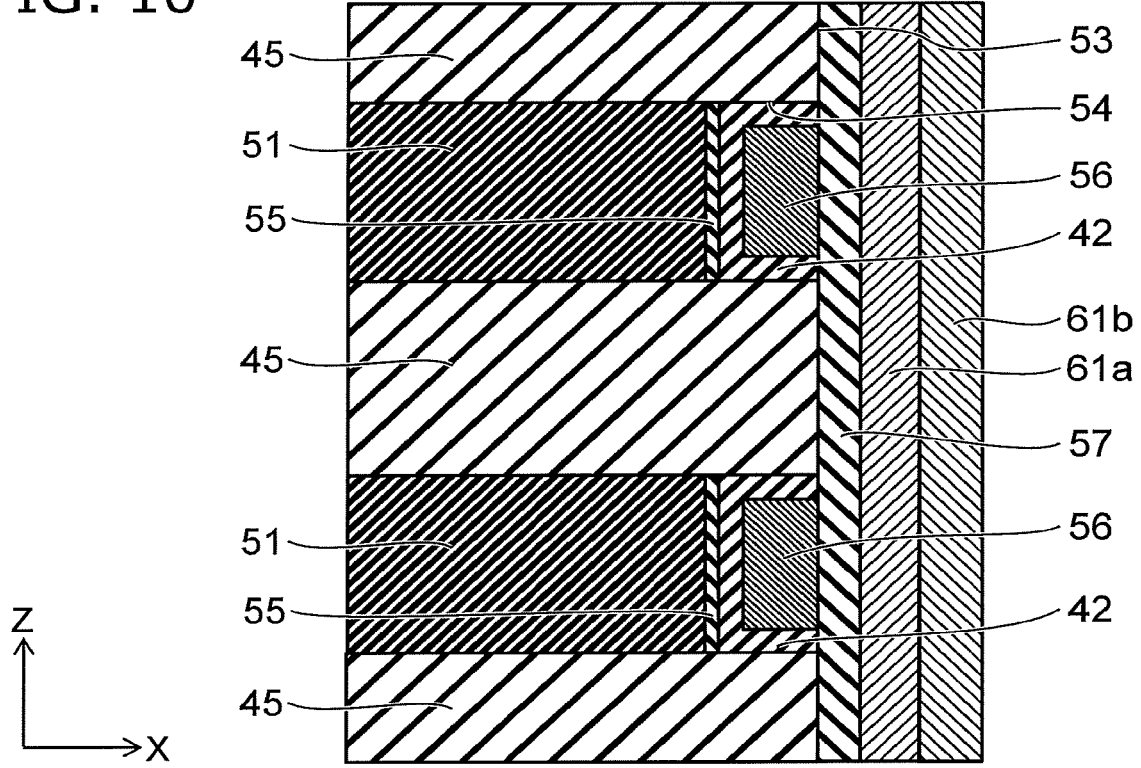

Then, as shown in FIG. 10, a silicon layer 61b is formed on the silicon layer 61a by depositing amorphous silicon using CVD, etc. At this time, the silicon layer 61b does not fill the entire memory trench 53. The silicon layer 61b contacts the cell source line 15 at the bottom surface of the memory trench 53.

Then, as shown in FIG. 11A and FIG. 11B, a mask pattern (not illustrated), in which lines-and-spaces extend in the X-direction and are repeated along the Y-direction, is formed on the stacked body 52. Then, anisotropic etching such as RIE or the like is performed using the mask pattern as a mask. Thereby, the silicon pillars 21 are formed by the silicon layers 61a and 61b being divided along the Y-direction. At this time, the silicon layer 61a becomes the silicon layers 21a ; and the silicon layer 61b becomes the silicon layers 21b. Also, the tunneling insulating films 44 are formed by the silicon oxide film 57 being divided along the Y-direction.

Then, isotropic etching such as wet etching or the like is performed via the openings formed by the anisotropic etching. Thereby, the silicon film 56 is divided along the Y-direction to become the floating gate electrodes 32. Also, the inter-electrode insulating film 42 is divided along the Y-direction. The silicon film 56 and the inter-electrode insulating film 42 are divided into a matrix configuration along the Y-direction and the Z-direction in this process because the silicon film 56 and the inter-electrode insulating film 42 already are divided along the Z-direction in the process shown in FIG. 8. Then, the insulating member 48 is filled into the memory trench 53 by depositing silicon oxide.

Then, as shown in FIG. 12, slits 63 that extend in the Y-direction are formed in the portions of the stacked body 52 between the memory trenches 53 by performing, for example, RIE. The slits 63 pierce the stacked body 52.

Then, as shown in FIG. 13A and FIG. 13B, isotropic etching of the sacrificial films 51 (referring to FIG. 12) is performed via the slits 63 using the stopper layers 55 as a stopper. For example, wet etching using hot phosphoric acid as an etchant is performed. Thereby, the sacrificial films 51 are removed; and recesses 64 that extend in the Y-direction are formed in the side surfaces of the slits 63. The stopper layers 55 are exposed at the back surfaces of the recesses 64.

Figure 14A:
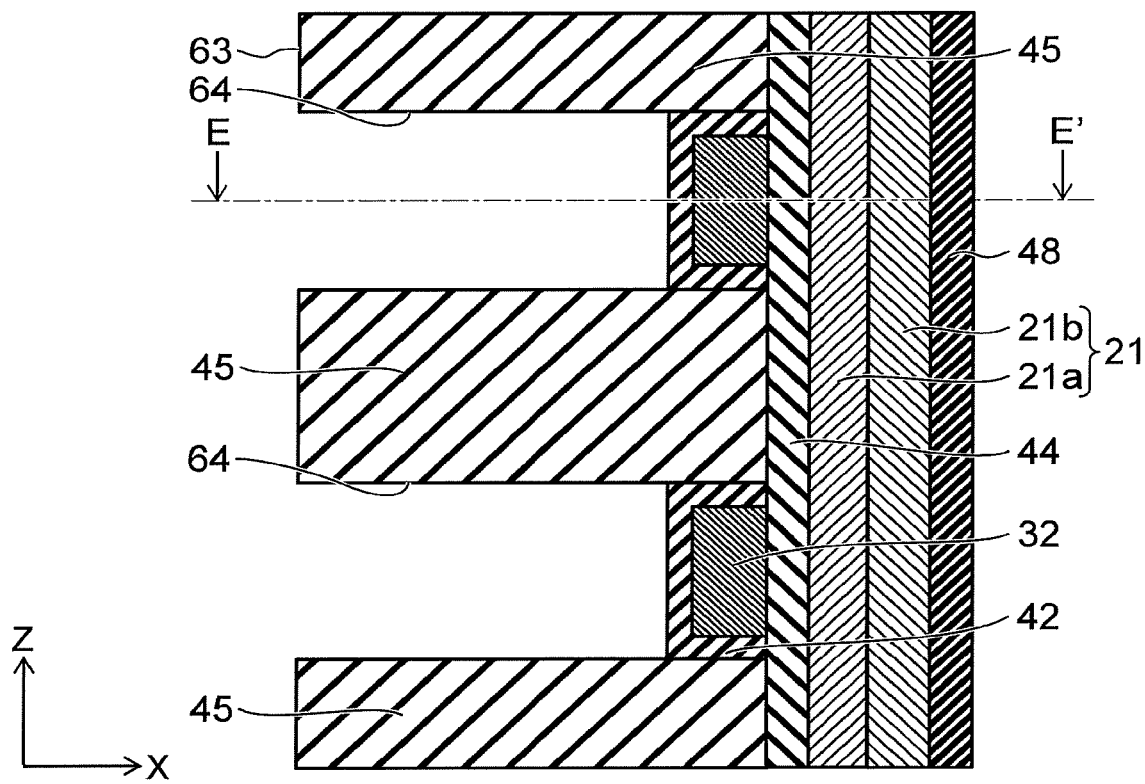
Figure 14B:
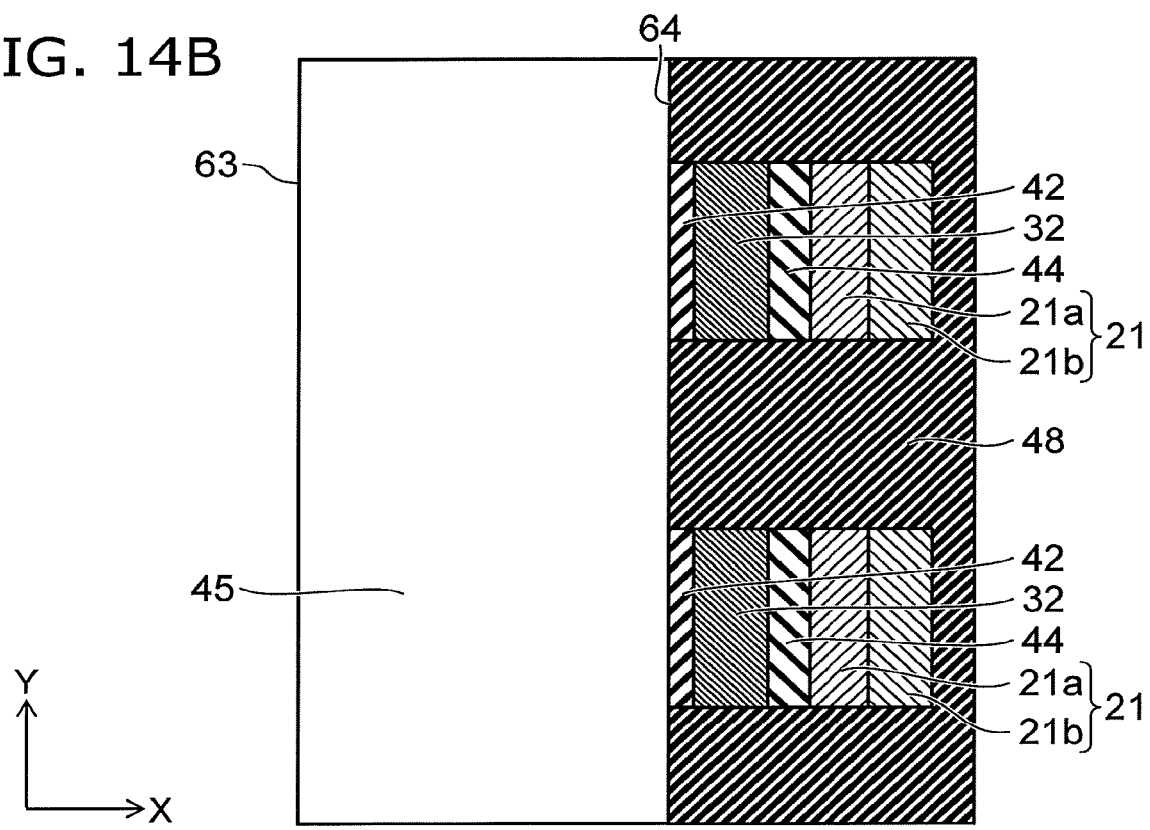

Then, as shown in FIG. 14A and FIG. 14B, by performing wet etching using, for example, DHF (diluted hydrofluoric acid) as the etchant via the slits 63, the stopper layers 55 that are made of silicon oxide and are on the back surfaces of the recesses 64 (referring to FIG. 11A) are removed. Thereby, the inter-electrode insulating films 42 that are made of silicon nitride and the insulating members 48 that are made of silicon oxide are exposed at the back surfaces of the recesses 64.

Figure 15A:
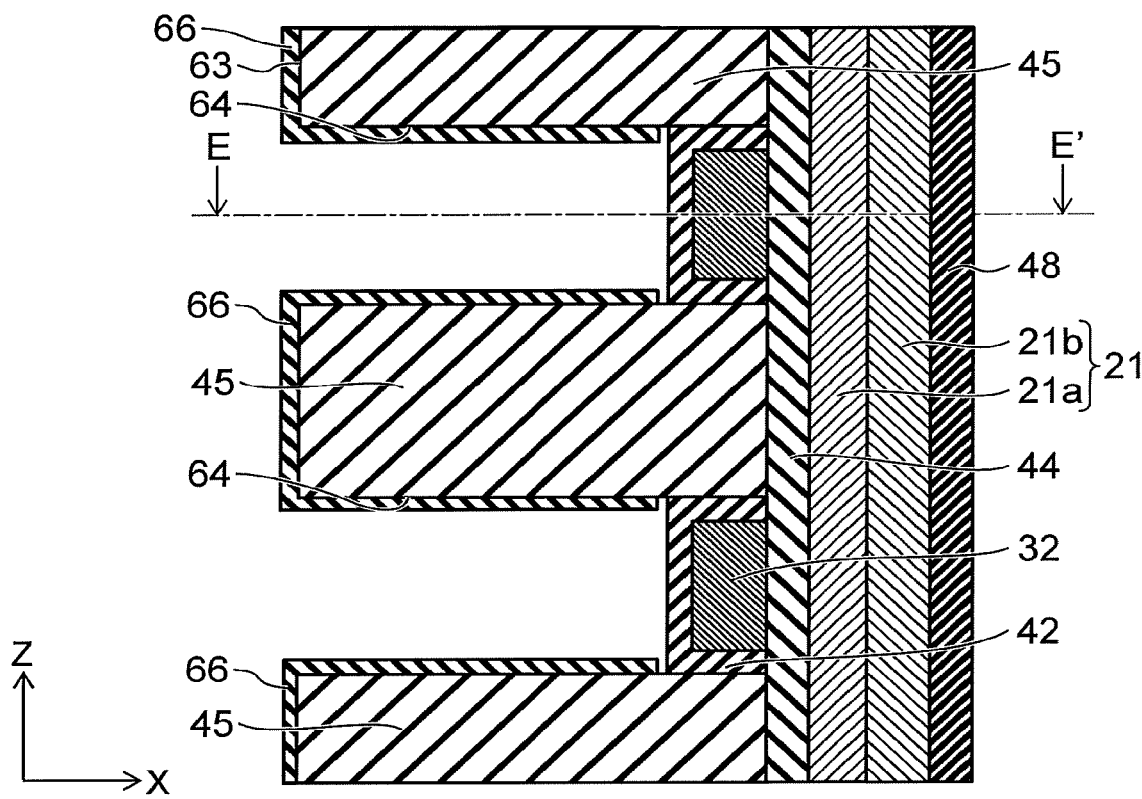
Figure 15B:
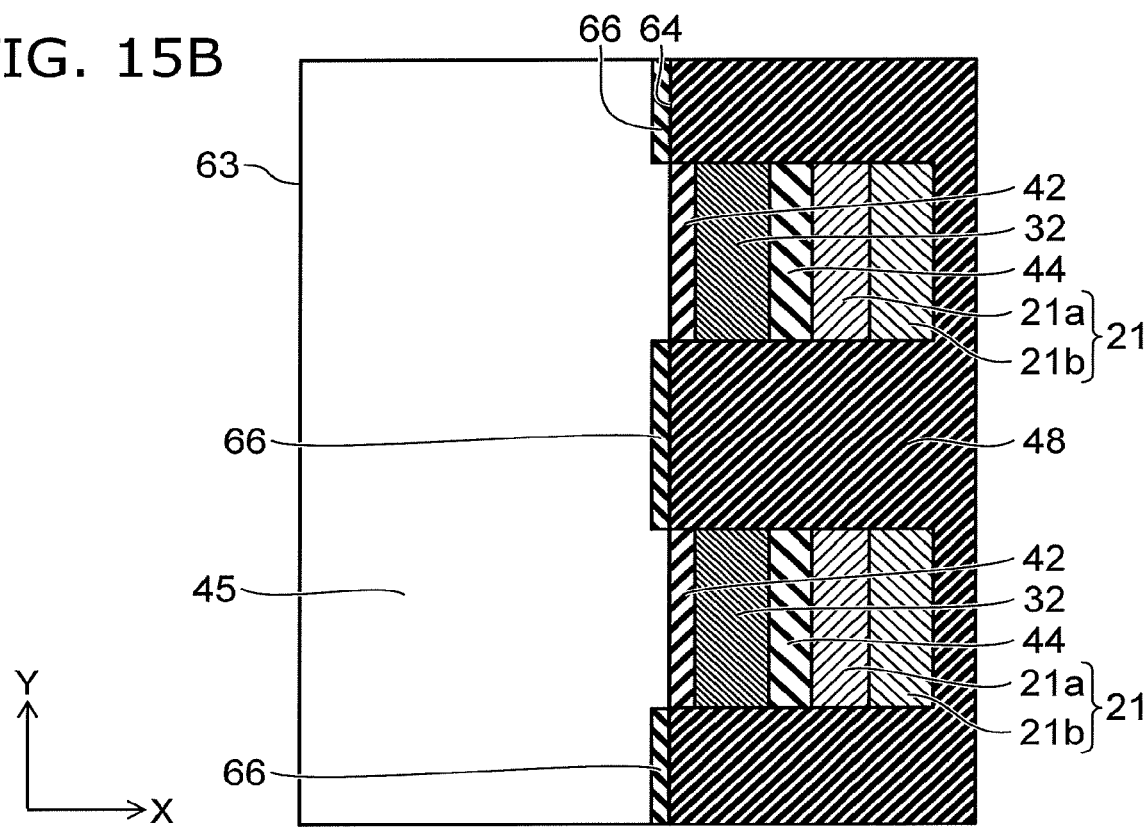

Then, as shown in FIG. 15A and FIG. 15B, silylation treatment using a silylating agent is performed via the slit 63. Thereby, a silyl group layer 66 in which a silyl group is bonded to a silicon atom is formed on the inner surface of the slit 63. For example, by using TMSDMA (trimethylsilyldimethylamine: $Si(CH_3)_3$—$N(CH_3)_2$)) as the silylating agent, a trimethylsilyl group (—$Si(CH_3)_3$) is bonded to the inner surface of the slit 63. The silyl group layer 66 is formed easily on silicon oxide but is not formed easily on silicon nitride. Therefore, of the inner surface of the slit 63, the silyl group layer 66 is formed on the exposed surfaces of the inter-layer insulating films 45 and an insulating member 68 made of silicon oxide; but the silyl group layer 66 is not formed on the exposed surfaces of the inter-electrode insulating films 42 made of silicon nitride.

Figure 16A:
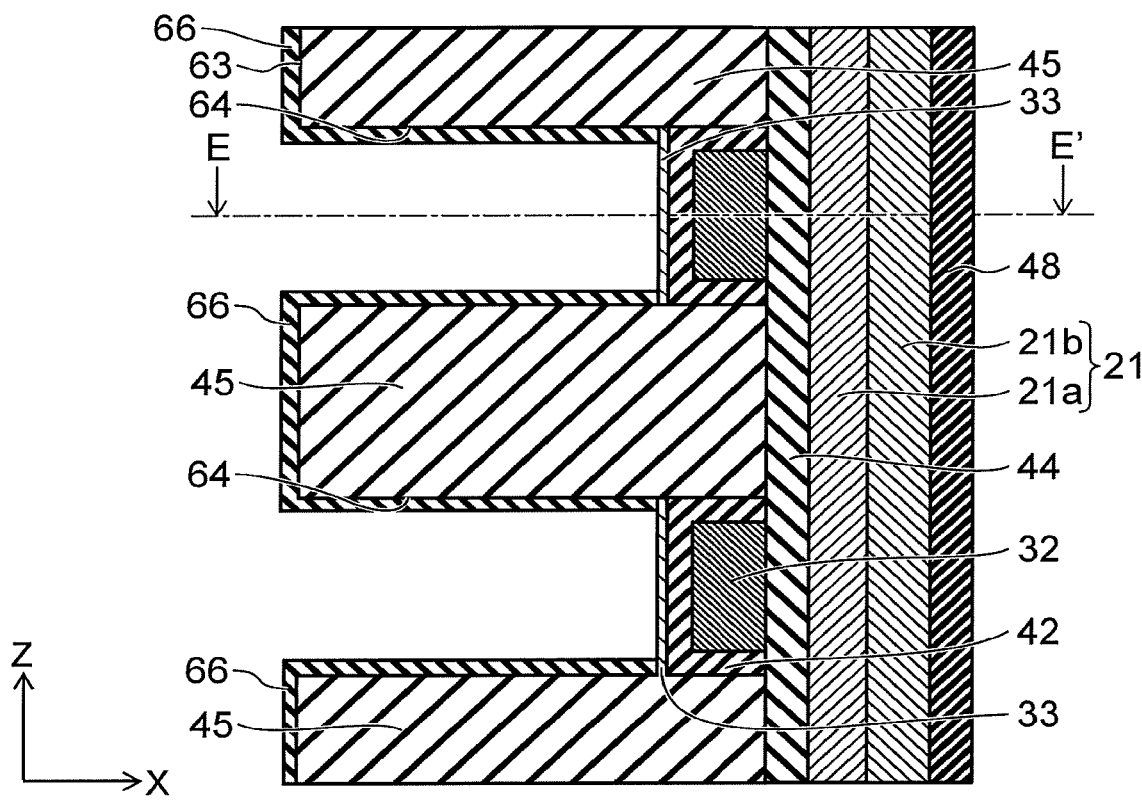
Figure 16B:
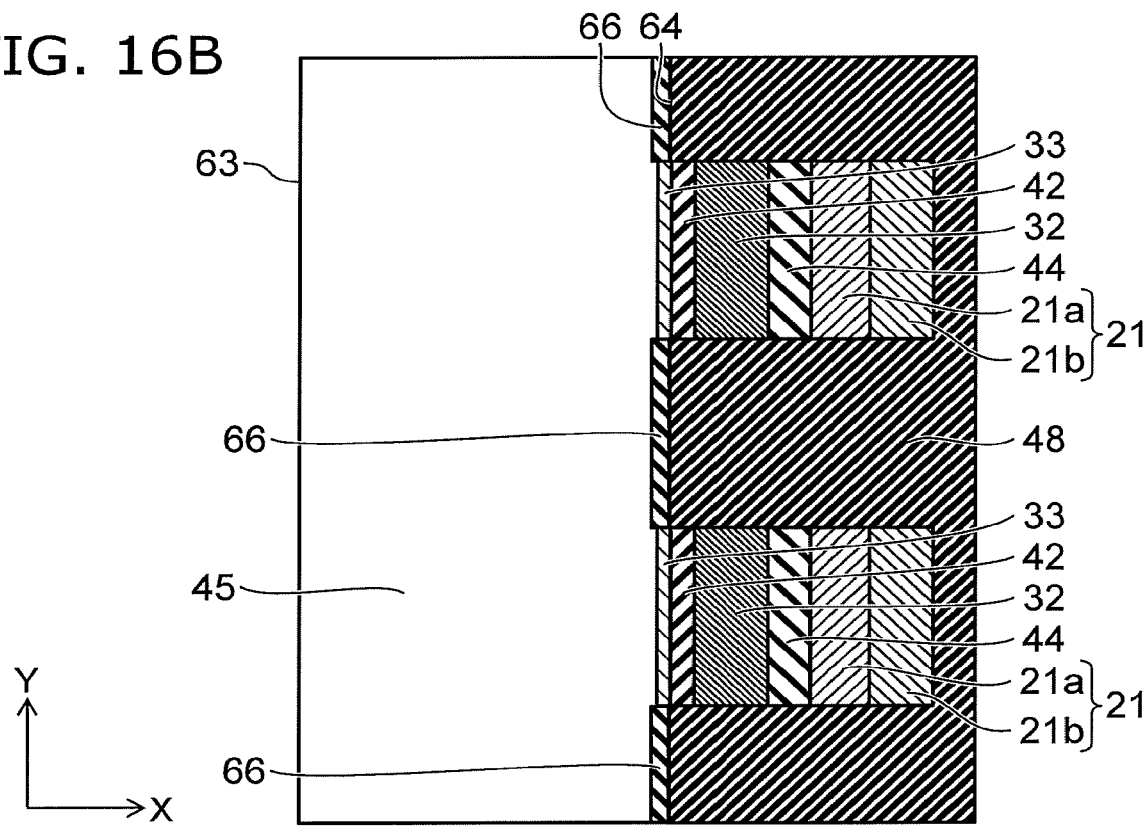

Then, as shown in FIG. 16A and FIG. 16B, deposition processing of a conductive material, e.g., titanium nitride (TiN), is performed using, for example, CVD or ALD (Atomic Layer Deposition: atomic layer deposition) via the slit 63. At this time, the incubation time from the start of the deposition processing of the conductive material using CVD or ALD until the conductive material is actually deposited is relatively short on the surface of the inter-electrode insulating films 42 where the silyl group layer 66 is not formed and is relatively long on the surfaces of the inter-layer insulating films 45 and the insulating member 68 where the silyl group layer 66 is formed. Accordingly, if the deposition processing of the conductive material is stopped at an appropriate time after starting, the conductive film 33 that is made of titanium nitride is formed on the surfaces of the inter-electrode insulating films 42; but the conductive film 33 is not formed on the surfaces of the inter-layer insulating films 45 and the insulating member 68. Thus, the conductive film 33 can be formed selectively only on the surfaces of the inter-electrode insulating films 42. The silyl group layer 66 is removed after forming the conductive film 33.

It is estimated that the reason that the incubation time on the surface of the inter-electrode insulating film 42 where the silyl group layer 66 is not formed is relatively short and the incubation time on the surfaces of the inter-layer insulating film 45 and the insulating member 68 where the silyl group layer 66 is formed is relatively long is because the silyl group becomes a steric hindrance, and the source gas of the CVD or the ALD does not easily reach the surface where the silyl group layer 66 is formed. Therefore, the silyl group layer 66 functions as a deposition-inhibiting layer for the conductive film 33.

Figure 17A:
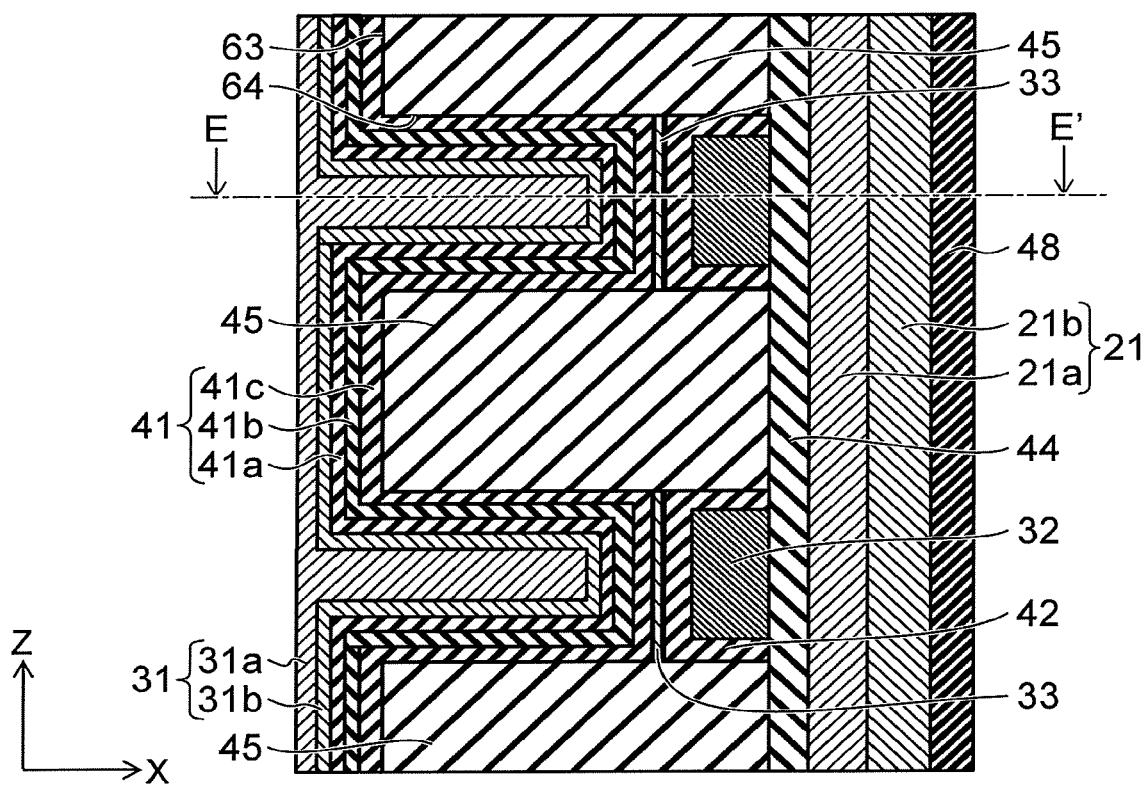
Figure 17B:
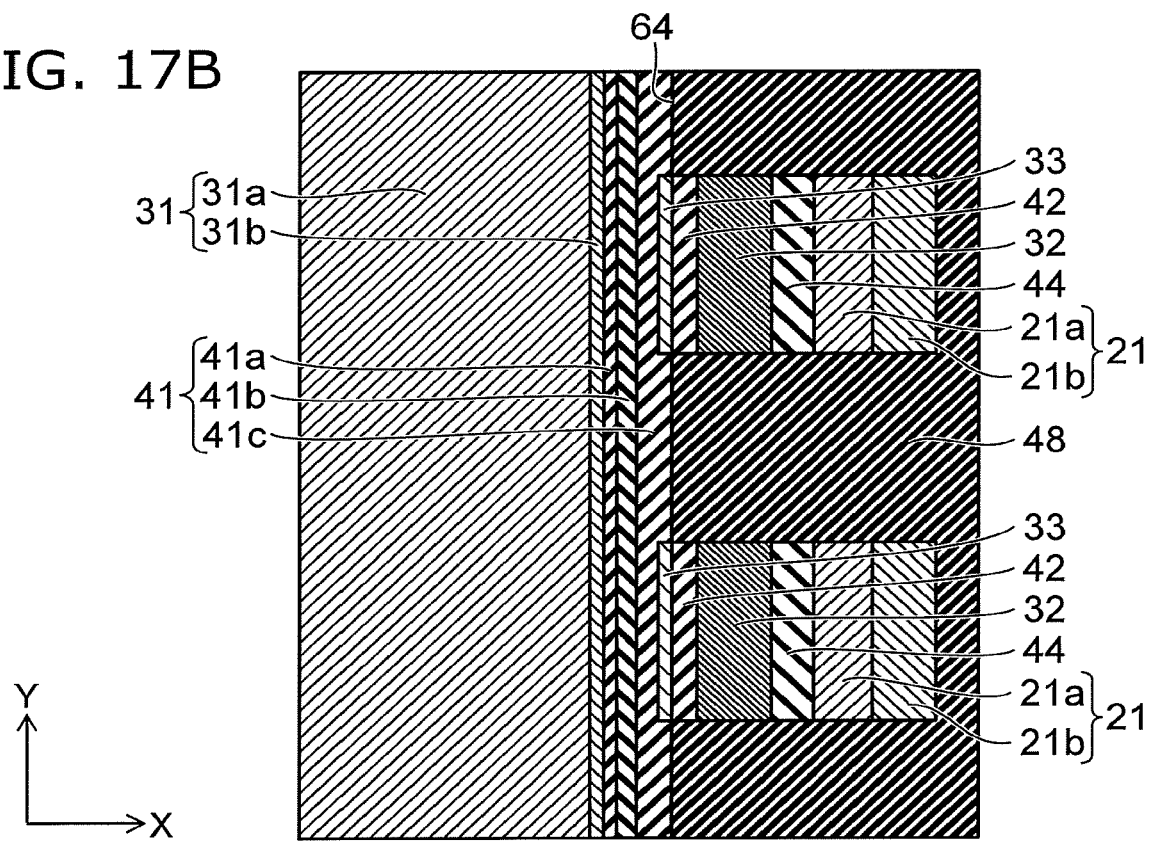

Then, via the slit 63 as shown in FIG. 17A and FIG. 17B, the hafnium silicon oxide layer 41c is formed by depositing hafnium silicon oxide (HfSiO); the silicon oxide layer 41b is formed by depositing silicon oxide ($SiO_2$); and the hafnium oxide layer 41a is formed by depositing hafnium oxide ($HfO_2$). Thereby, the blocking insulating film 41 is formed on the slit 63 and the inner surfaces of the recesses 64. At this time, the blocking insulating film 41 does not fill the entire interior of the recess 64.

Then, titanium nitride (TiN) is deposited inside the slit 63 using, for example, CVD. Thereby, the barrier metal layer 31b is formed on the side surface of the blocking insulating film 41. Then, tungsten is deposited inside the slit 63 by, for example, CVD. Thereby, the main portion 31a is formed on the side surface of the barrier metal layer 31b. The main portion 31a. fills the entire interiors of the recesses 64. Thus, the control gate electrode 31 is formed inside the slit 63 and inside the recesses 64.

Then, as shown in FIG. 2A and FIG. 2B, etch-back of the control gate electrode 31 is performed via the slit 63. Thereby, the portion of the control gate electrode 31 disposed inside the recesses 64 is caused to remain; and the portion of the control gate electrode 31 disposed outside the recesses 64 is removed. Then, etch-back of the blocking insulating film 41 is performed via the slit 63. Thereby, the portion of the blocking insulating film 41 disposed inside the recesses 64 is caused to remain; and the portion of the blocking insulating film 41 disposed outside the recesses 64 is removed. Thereby, the blocking insulating film 41 also is divided every recess 64. Then, the insulating member 46 is filled into the slit 63 by depositing silicon oxide.

Then, as shown in FIG. 1A and FIG. 1B, a slit that extends in the Y-direction and reaches the cell source line 15 is formed inside a portion of the insulating member 46. Then, the source electrode 16 is formed by filling a conductive material such as, for example, tungsten, etc., into the slit. Also, the connection members 24 are formed on the pillar pairs 22 and connected to the pillar pairs 22. Then, the connection members 24 are buried in an inter-layer insulating film 49. Then, the plugs 25 are formed inside the inter-layer insulating film 49 and connected to the connection members 24. Then, the bit lines 26 are formed on the inter-layer insulating film 49 and connected to the plugs 25. Thus, the semiconductor memory device 1 according to the embodiment is manufactured.

Effects of the embodiment will now be described.

In the semiconductor memory device 1 according to the embodiment as shown in FIG. 2A and FIG. 2B, the conductive film 33 that is made of titanium nitride is provided between the floating gate electrode 32 and the control gate electrode 31. Therefore, the electrons that are injected from the silicon pillar via the tunneling insulating film 44 can be stopped effectively by the conductive film 33. Thereby, even in the case where the floating gate electrode 32 is formed to be thin in the X-direction, the electrons that pass through the floating gate electrode 32 and enter the blocking insulating film 41 are suppressed; and the injection efficiency of the electrons into the charge storage member made of the floating gate electrode 32 and the conductive film 33 can be maintained to be high. Also, the work function of the titanium nitride (TiN) included in the conductive film 33 is about 4.7 eV; and the work function of the silicon included in the floating gate electrode 32 is about 4.15 eV; therefore, the work function of the conductive film 33 is higher than the work function of the floating gate electrode 32. Thereby, the retention of the injected electrons is high; accordingly, the data retention characteristics of the memory cells are good.

Also, in the method for manufacturing the semiconductor memory device according to the embodiment, the silyl group layer 66 can be formed selectively only on the exposed surfaces of the inter-layer insulating film 45 and the insulating member by forming the inter-layer insulating film 45 and the insulating member 48 of silicon oxide and by forming the inter-electrode insulating film 42 of silicon nitride as shown in FIGS. 16A and 16B. Also, because the silyl group layer 66 becomes a deposition-inhibiting layer by using a vapor deposition method such as CVD, ALD, etc., the conductive film 33 can be formed selectively only on the exposed surface of the inter-electrode insulating film 42 substantially without forming the conductive film 33 on the exposed surfaces of the inter-layer insulating film 45 and the insulating member 48 by appropriately controlling the deposition time. Therefore, a process of dividing the conductive film 33 is unnecessary. As a result, the manufacturing processes are simple; the mutually-adjacent conductive films 33 are not shorted; and a semiconductor memory device can be realized in which the manufacturing is easy and the reliability is high.

Although an example is shown in the embodiment in which the silyl group layer 66 is formed of a trimethylsilyl group, this is not limited thereto; and the silyl group layer 66 may be formed of another silyl group. For example, the silyl group layer 66 may be formed of a butyldimethylsilyl group. Also, the combination of the foundation is not limited to SiN and $SiO_2$. Generally, because a silyl group is replaced with an OH group (a hydroxy group) by a silane coupling reaction, the silyl group bonds easily to a foundation having many OH groups. Also, there are many OH groups in $SiO_2$. Therefore, for example, the combination of the foundation may be $SiO_2$ and Si. Further, a layer that is made of a group other than a silyl group may be formed as the deposition-inhibiting layer.

Second Embodiment

A second embodiment will now be described.

Figure 18A:
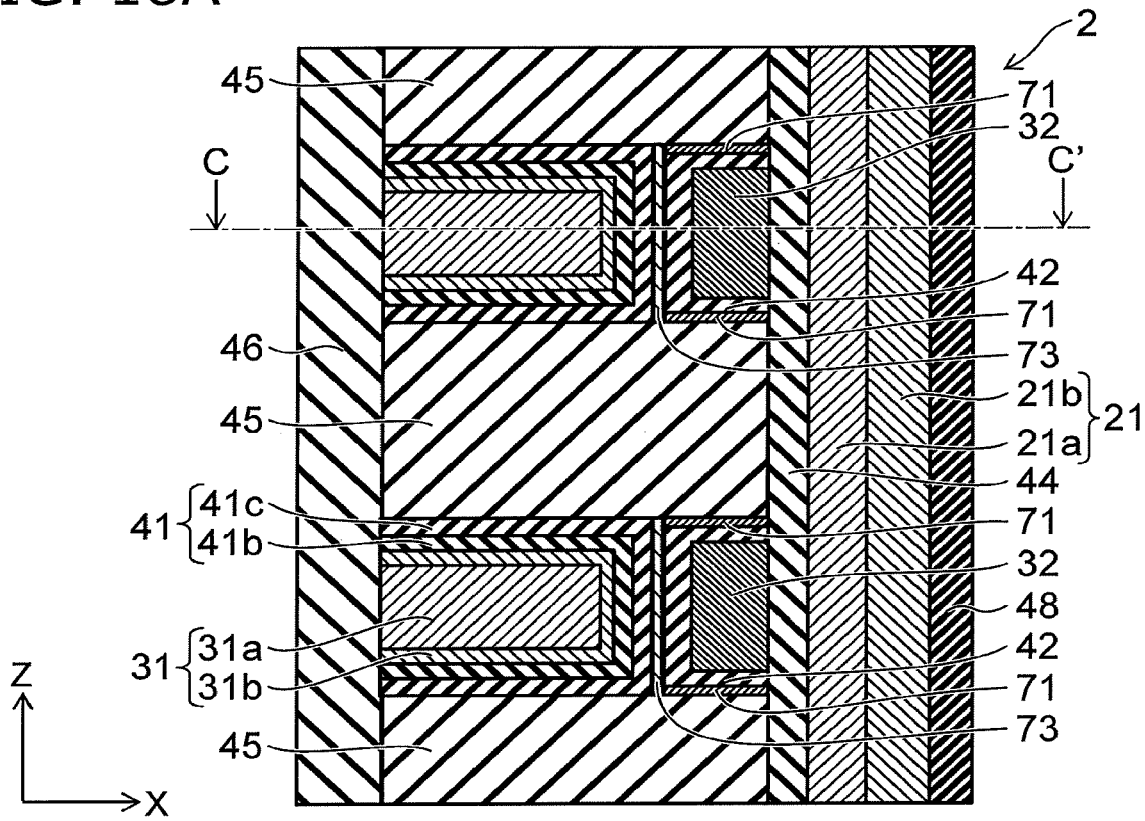
FIG. 18A and FIG. 18B are cross-sectional views showing a semiconductor memory device according to a second embodiment.
Figure 18B:
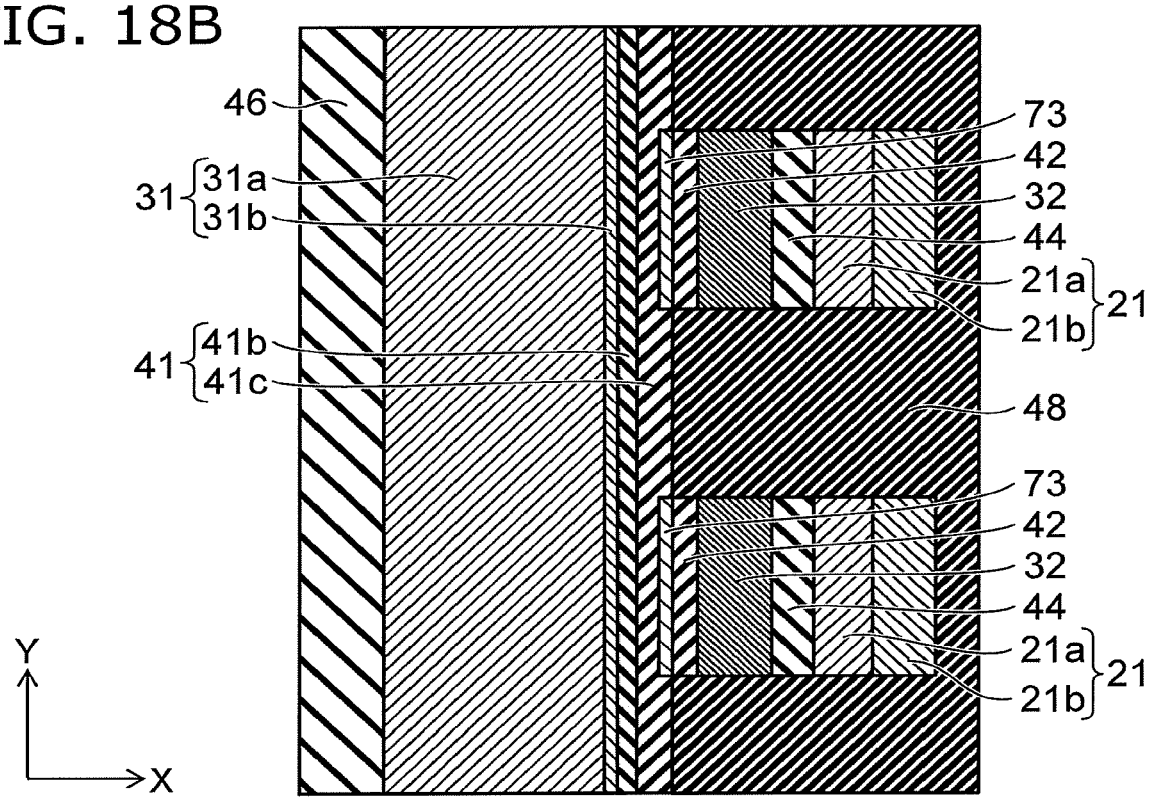

FIG. 18A and FIG. 18B are cross-sectional views showing a semiconductor memory device according to the embodiment.

The region shown in FIG. 18A corresponds to region A of FIG. 1A; and the region shown in FIG. 18B corresponds to region B of FIG. 1B. Also, FIG. 18B shows a cross section along line C-C' shown in FIG. 18A.

As shown in FIG. 18A and FIG. 18B, the semiconductor memory device 2 according to the embodiment differs from the semiconductor memory device 1 according to the first embodiment described above (referring to FIG. 2A) in that a silicon layer 71 is provided between the inter-electrode insulating film 42 and the inter-layer insulating film 45; a conductive film 73 that is made of a metal silicide is provided instead of the conductive film 33 made of titanium nitride; and the hafnium oxide layer 41a of the blocking insulating film 41 is not provided. The silicon layer 71 is a layer having silicon as a major component; for example, the composition of the silicon layer 71 is the same as the composition of the floating gate electrode 32; and the silicon layer 71 is made of, for example, polysilicon. For example, the conductive film 73 is made of a titanium silicide or a nickel silicide.

A method for manufacturing the semiconductor memory device according to the embodiment will now be described.

Figure 19:
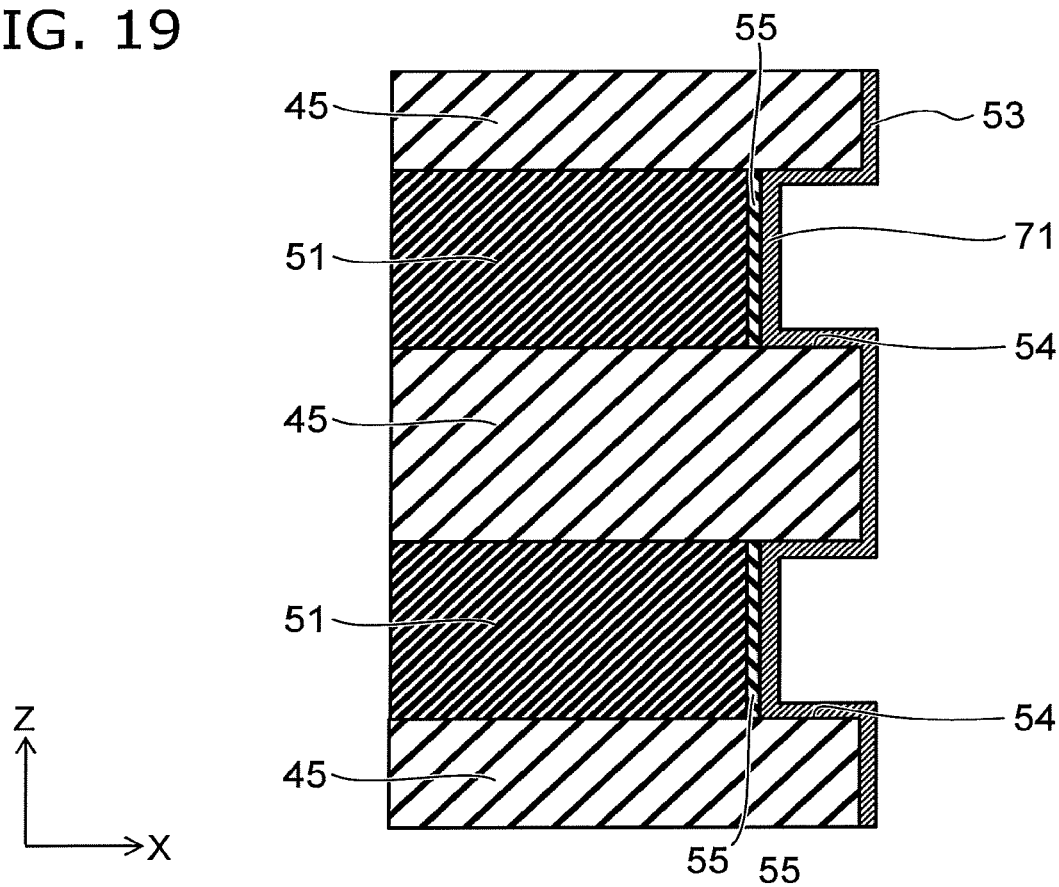
FIG. 19 to FIG. 25B are cross-sectional views showing a method for manufacturing the semiconductor memory device according to the second embodiment.
Figure 20:
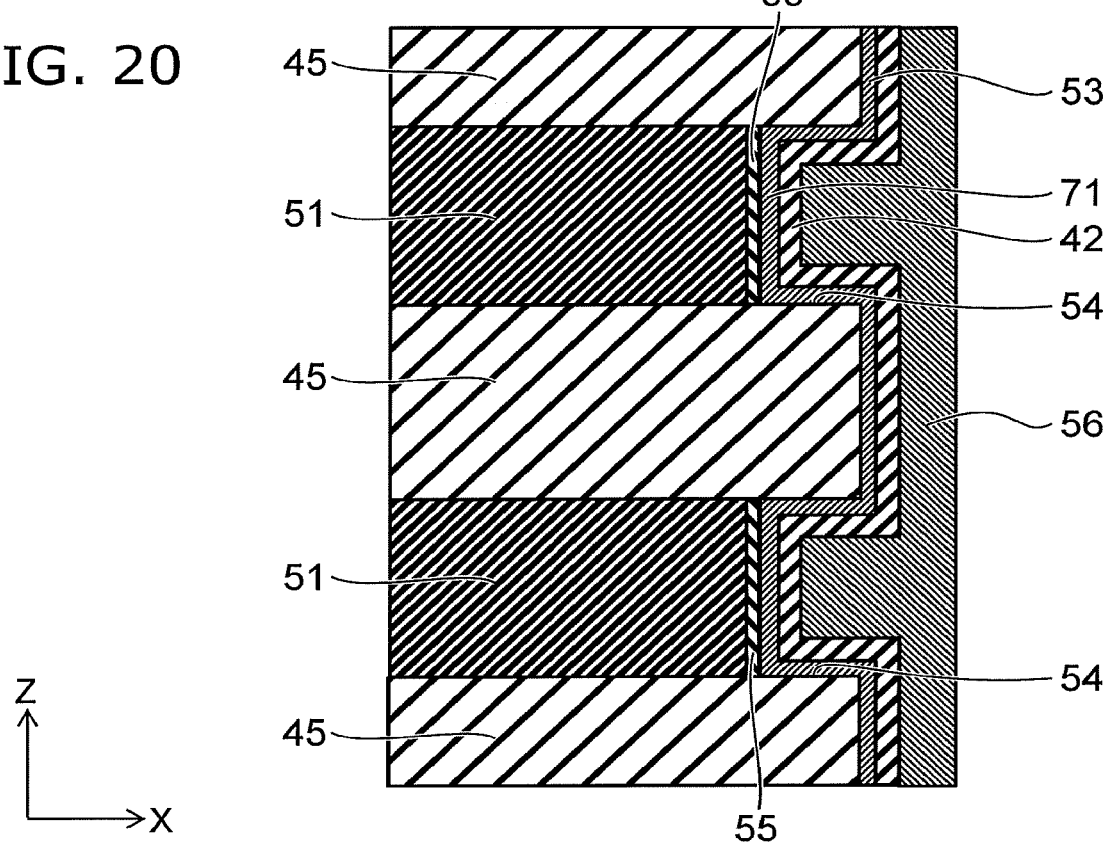
Figure 21:
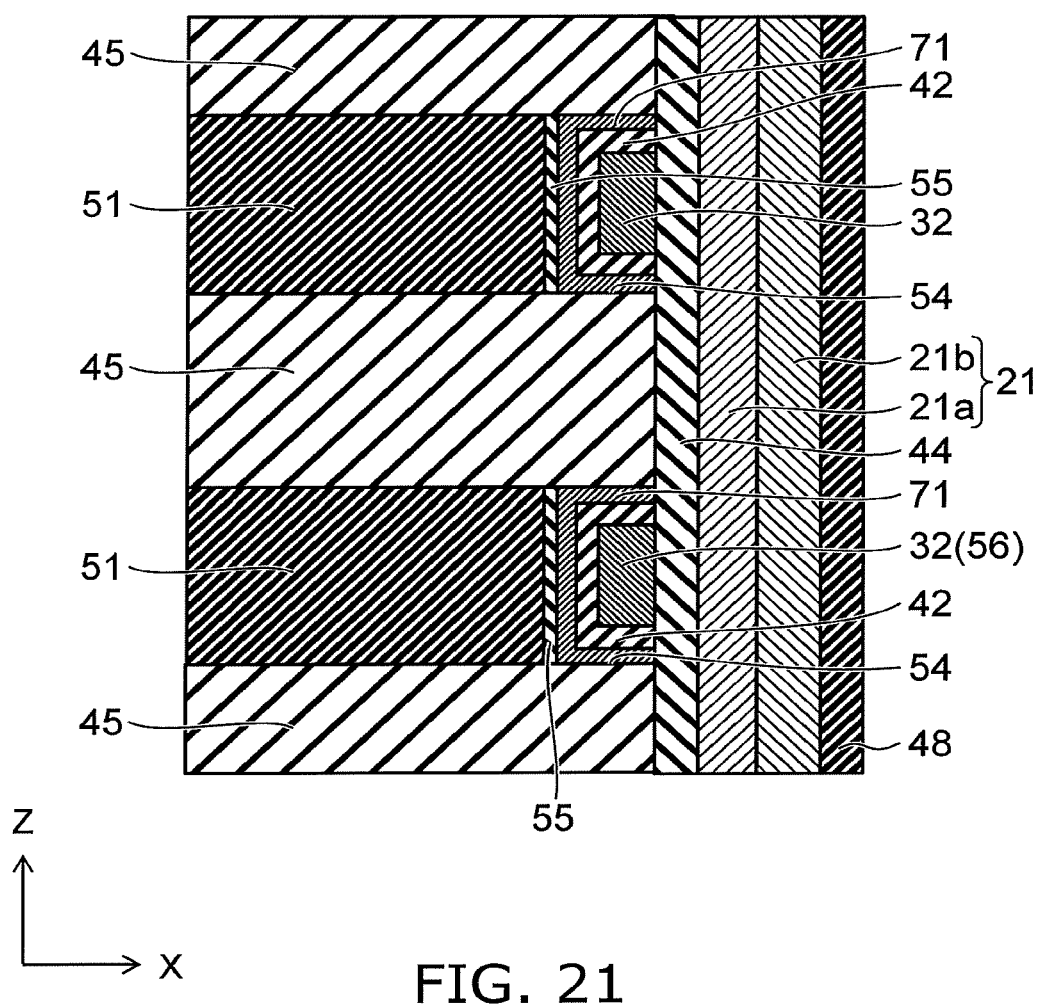

FIG. 19 to FIG. 21 are cross-sectional views showing the method for manufacturing the semiconductor memory device according to the embodiment.

FIG. 22A, FIG. 22B to FIG. 25A, and FIG. 25B are cross-sectional views showing the method for manufacturing the semiconductor memory device according to the embodiment.

FIG. 19 to FIG. 21 and FIG. 22A show a region corresponding to FIG. 18A. FIG. 22B shows a cross section along line E-E' shown in FIG. 22A. This is similar for FIG. 23A to FIG. 25B as well.

First, the processes shown in FIG. 3 to FIG. 6 are implemented. Namely, the insulating film 11 and the cell source line 15 are formed on the silicon substrate 10; the stacked body 52 is formed by alternately depositing the inter-layer insulating films 45 and the sacrificial films 51; the memory trenches 53 are formed in the stacked body 52; the recesses 54 are formed by recessing the sacrificial films 51 via the memory trenches 53; and the stopper layers 55 are formed on the back surfaces of the recesses 54.

Then, as shown in FIG. 19, the silicon layer 71 is formed on the inner surface of the memory trench 53 by depositing silicon via the memory trench 53. At this time, although the silicon layer 71 is formed also on the inner surfaces of the recesses 54, the silicon layer 71 does not completely fill the interiors of the recesses 54.

Then, as shown in FIG. 20, the inter-electrode insulating film 42 is formed on the silicon layer 71 by depositing silicon nitride via the memory trench 53. Then, the silicon film 56 is formed on the inter-electrode insulating film 42 by depositing silicon via the memory trench 53.

Then, as shown in FIG. 21, the silicon film 56, the inter-electrode insulating film 42, and the silicon layer 71 are recessed via the memory trench 53 and are caused to remain only inside the recesses 54. Then, the structure inside the memory trench 53 is made by methods similar to those of the first embodiment described above.

Then, as shown in FIG. 12, the slits 63 that extend in the Y-direction are formed in the stacked body 52.

Figure 22A:
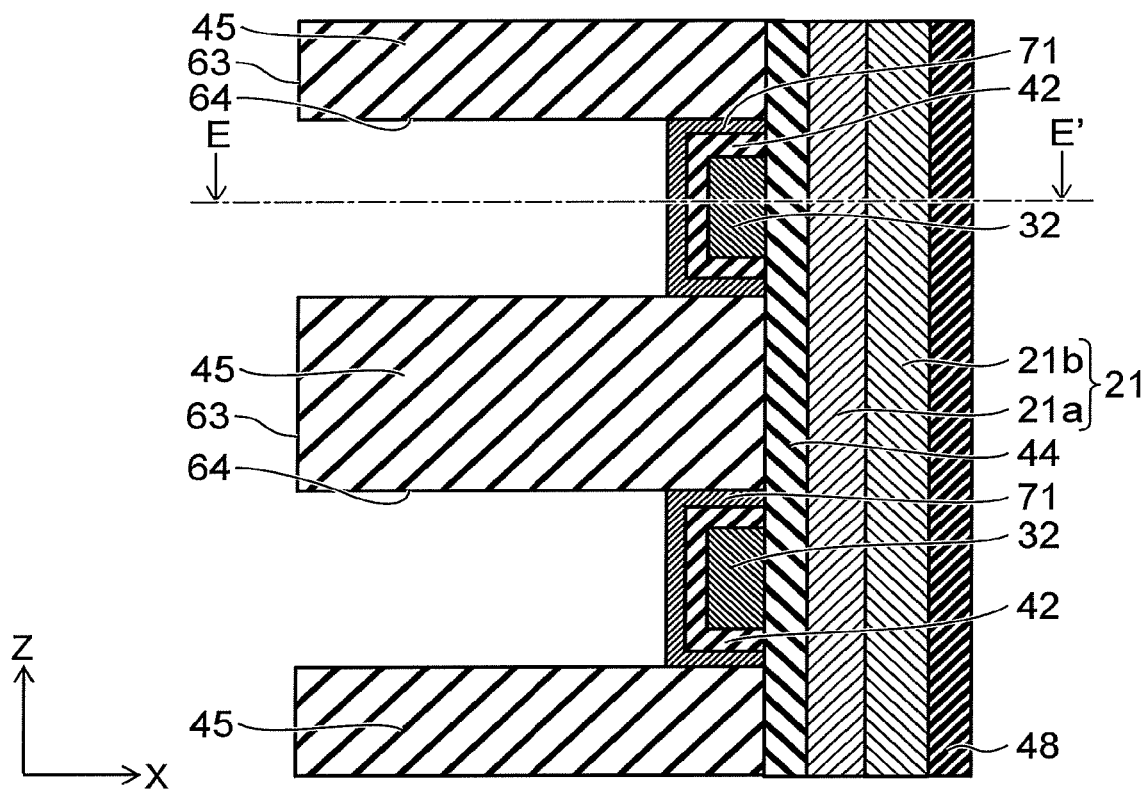
Figure 22B:
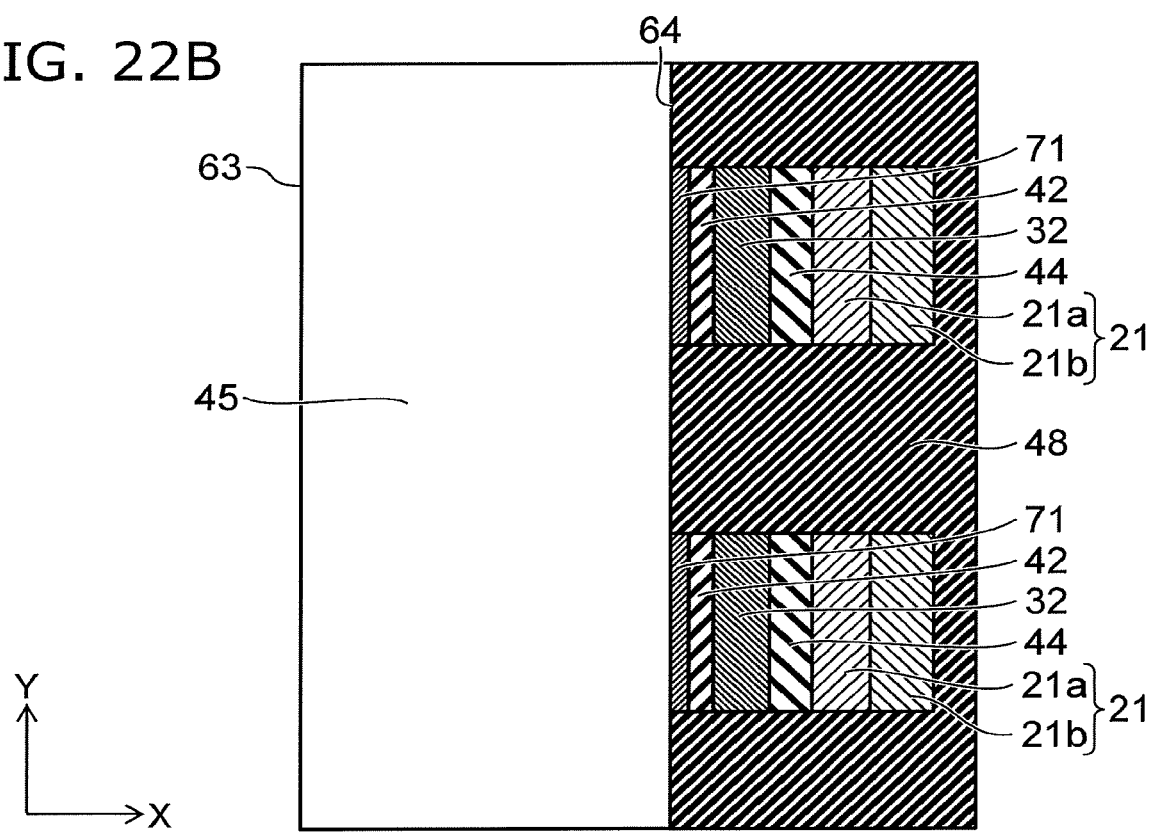

Then, as shown in FIG. 22A and FIG. 22B, wet etching is performed via the slit 63 using the stopper layers 55 (referring to FIG. 21) as a stopper. Thereby, the sacrificial films 51 are removed; and the recesses 64 are formed in the inner surface of the slit 63. Then, the stopper layers 55 are removed via the slit 63 and the recesses 64. Thereby, the silicon layers 71 and the insulating member 48 are exposed at the back surfaces of the recesses 64.

Figure 23A:
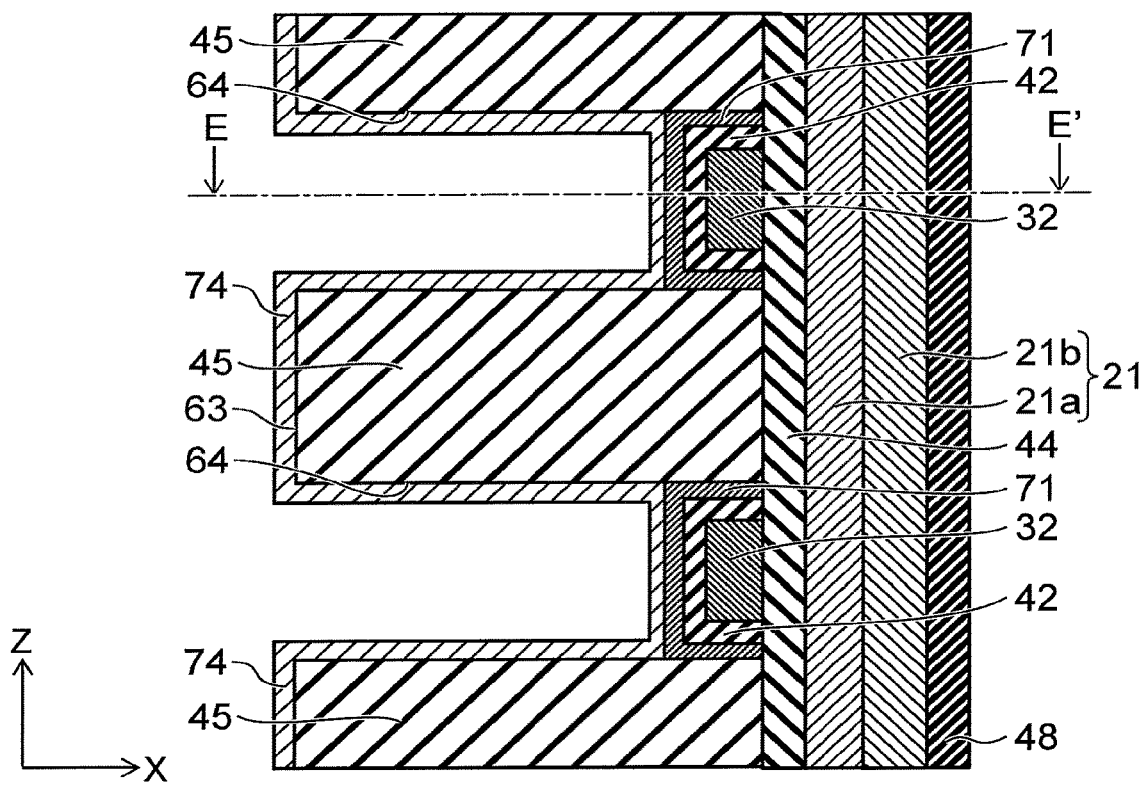
Figure 23B:
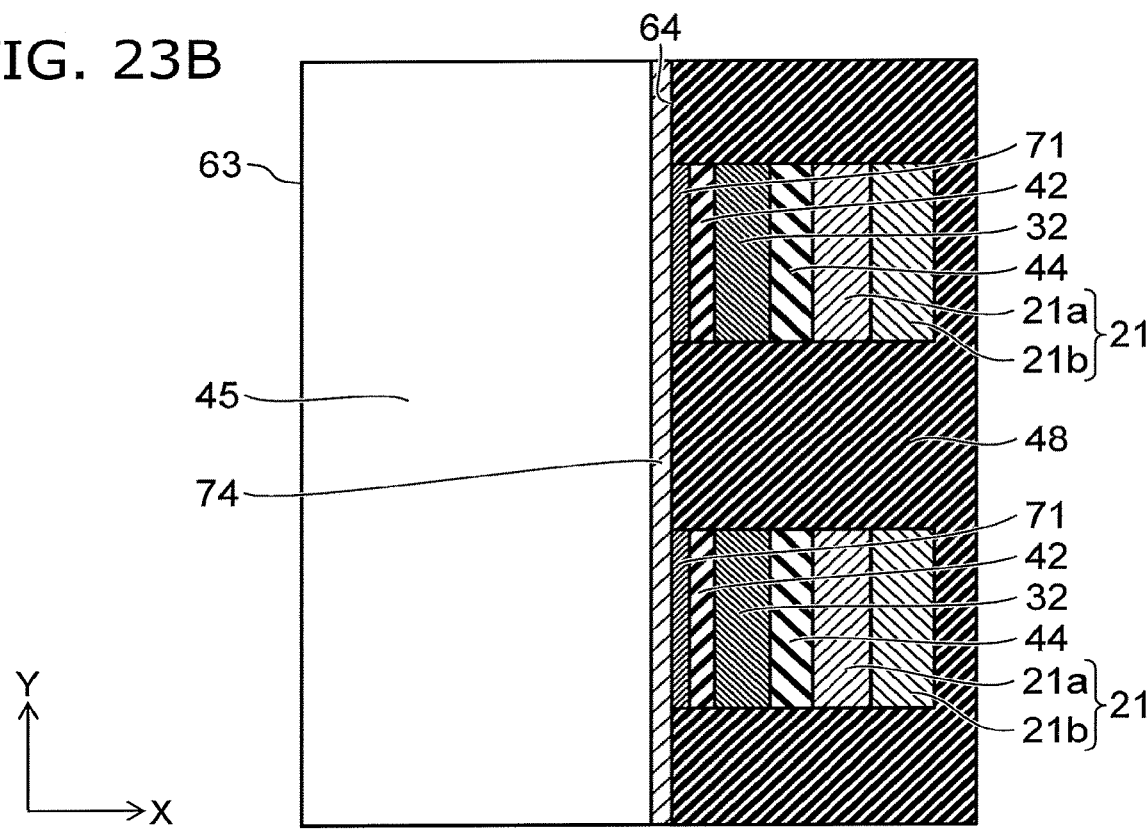

Then, as shown in FIG. 23A and FIG. 23B, a metal such as titanium (Ti), nickel (Ni), or the like is deposited via the slit 63 and the recesses 64. Thereby, a metal layer 74 is formed on the slit 63 and the inner surfaces of the recesses 64. At this time, a portion of the metal layer 74 contacts the silicon layers 71 at the back surfaces of the recesses 64 because the silicon layers 71 are exposed at the back surfaces of the recesses 64.

Figure 24A:
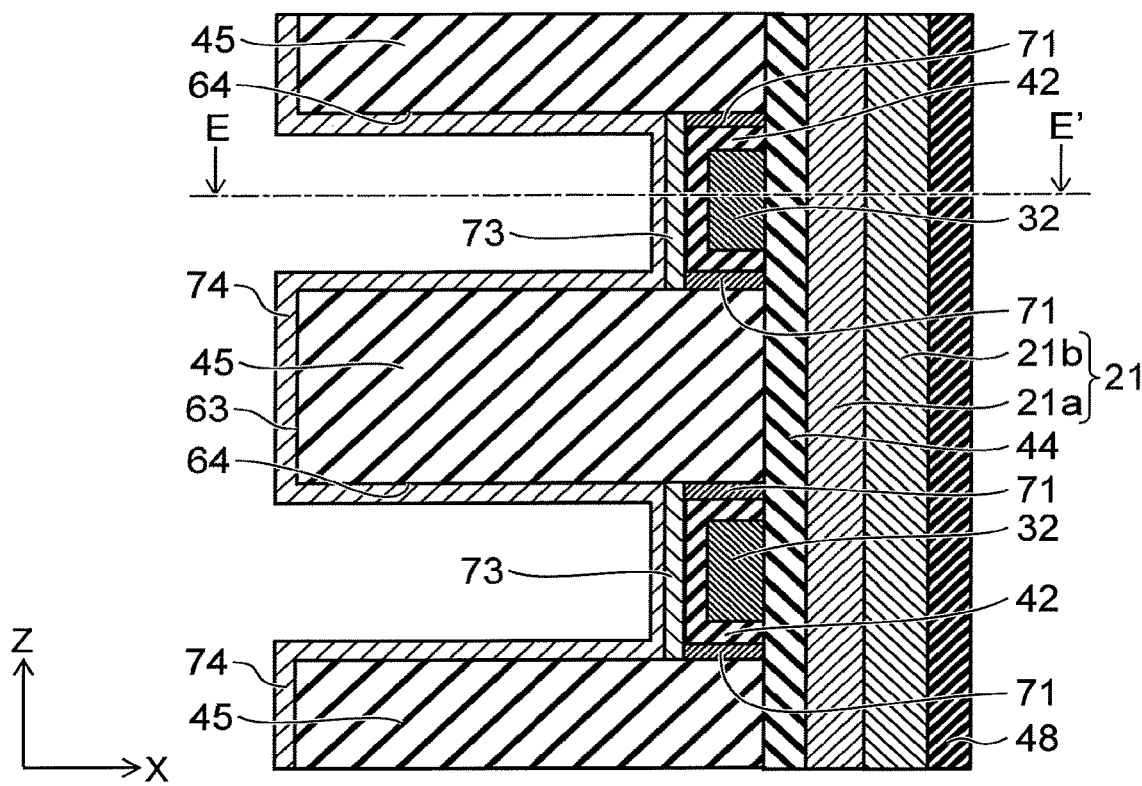
Figure 24B:
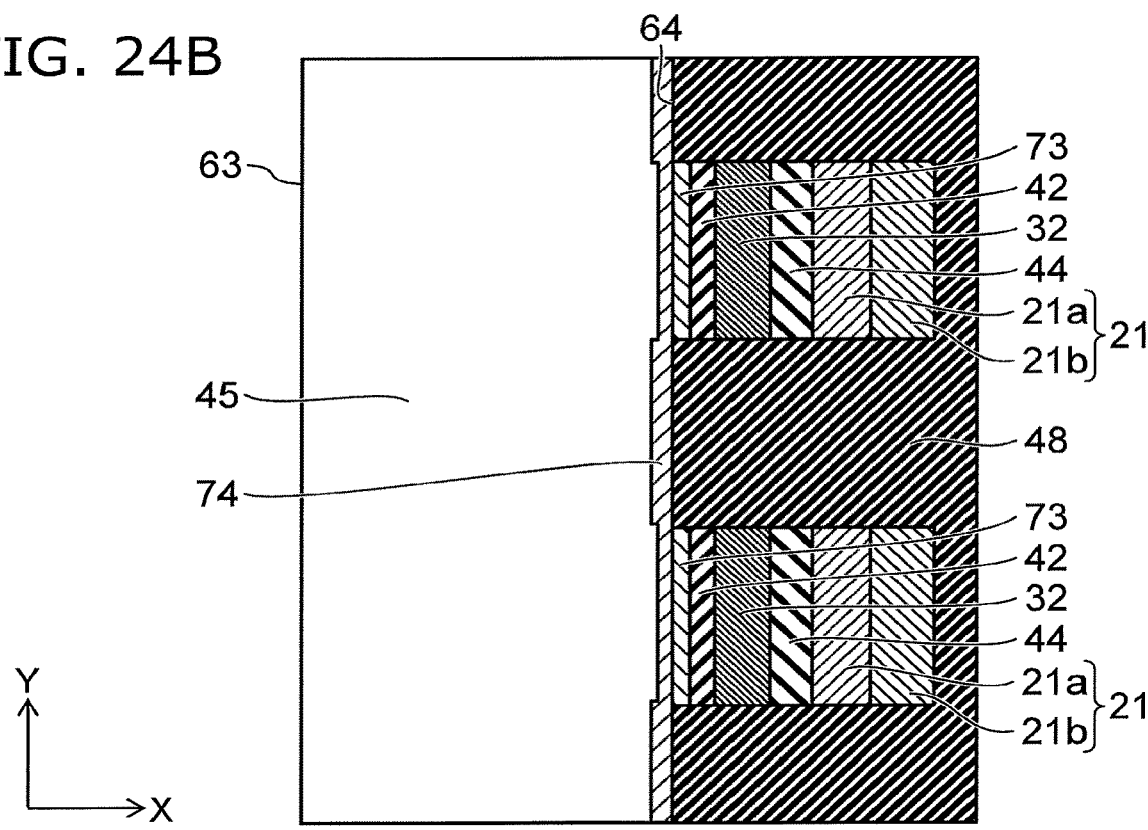

Then, as shown in FIG. 24A and FIG. 24B, the silicon that is included in the silicon layers 71 and the metal that is included in the metal layer 74 are caused to react by performing annealing. Thereby, the conductive films 73 are formed by a metal silicide being formed at the contact portions between the silicon layers 71 and the metal layer 74. At this time, the portions of the silicon layer 71 not contacting the metal layer 74, i.e., the portions positioned on the two Z-direction sides when viewed from the inter-electrode insulating film 42, remains as-is as the silicon layer 71. Also, the portion of the metal layer 74 not contacting the silicon layer 71, i.e., the unreacted portion, remains as-is as the metal layer 74.

Figure 25A:
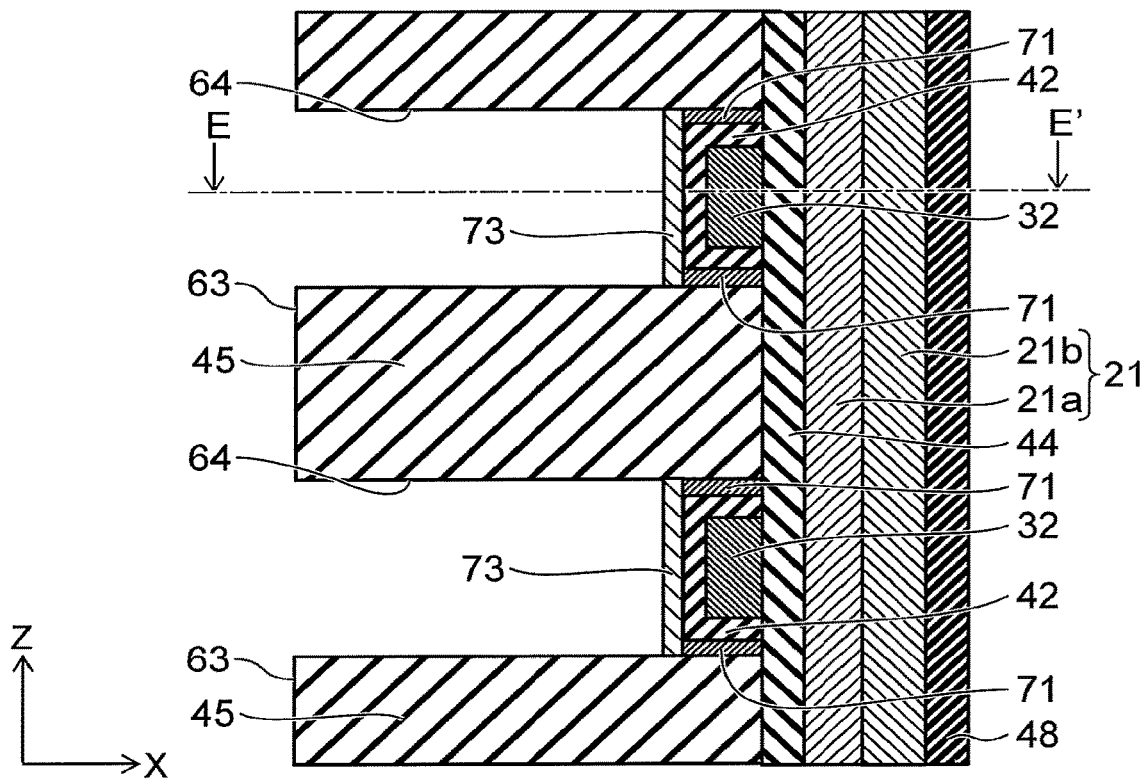
Figure 25B:
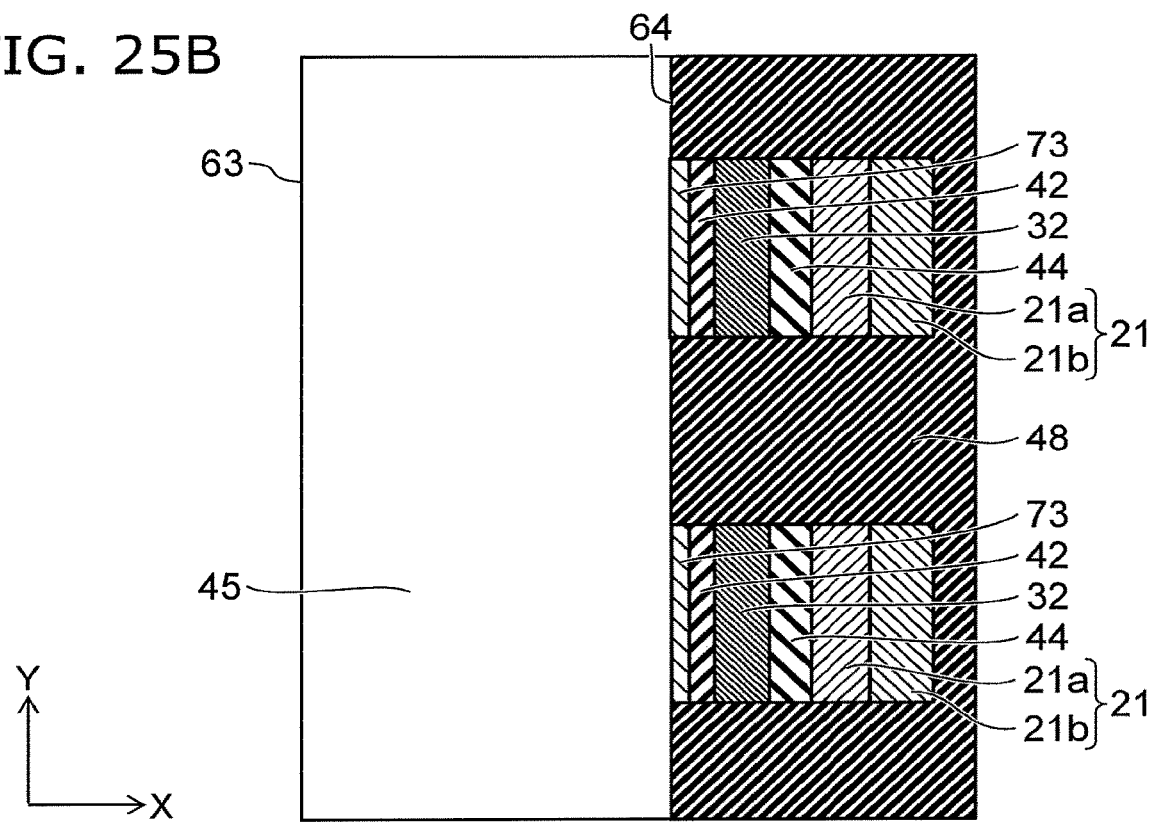

Then, as shown in FIG. 25A and FIG. 25B, cleaning by wet processing is performed; and the unreacted metal layer 74 (referring to FIG. 24A) is removed.

The subsequent processes are similar to those of the first embodiment described above. For example, the blocking insulating film 71 and the control gate electrode 31 are formed via the slit 63. However, the hafnium oxide layer 41a is not formed in the embodiment. Thus, as shown in FIG. 18A and FIG. 18B, the semiconductor memory device 2 according to the embodiment is manufactured.

Effects of the embodiment will now be described.

In the embodiment, the silicon layer 71 is formed on the inner surfaces of the recesses 54 in the process shown in FIG. 19; the silicon layer 71 is exposed at the back surfaces of the recesses 64 when removing the sacrificial films 51 from the slit 63 side in the process shown in FIG. 22A and FIG. 22B; the metal layer 74 is formed on the inner surfaces of the recesses 64 and caused to contact the silicon layer 71 in the process shown in FIG. 23A and FIG. 23B; the conductive film 73 is formed by causing a silicide reaction between the silicon layer 71 and the metal layer 74 by annealing in the process shown in FIG. 24A and FIG. 24B; and the unreacted metal layer 74 is removed in the process shown in FIG. 25A and FIG. 25B. Thereby, the conductive film 73 can be formed at each position opposing the floating gate electrode 32 with the inter-electrode insulating film 42 interposed. As a result, a process of dividing the conductive film 73 is unnecessary. Therefore, the manufacturing of the semiconductor memory device according to the embodiment is easy.

Otherwise, the configuration, the manufacturing method, and the effects of the embodiment are similar to those of the first embodiment described above.

Third Embodiment

A third embodiment will now be described.

Figure 26:
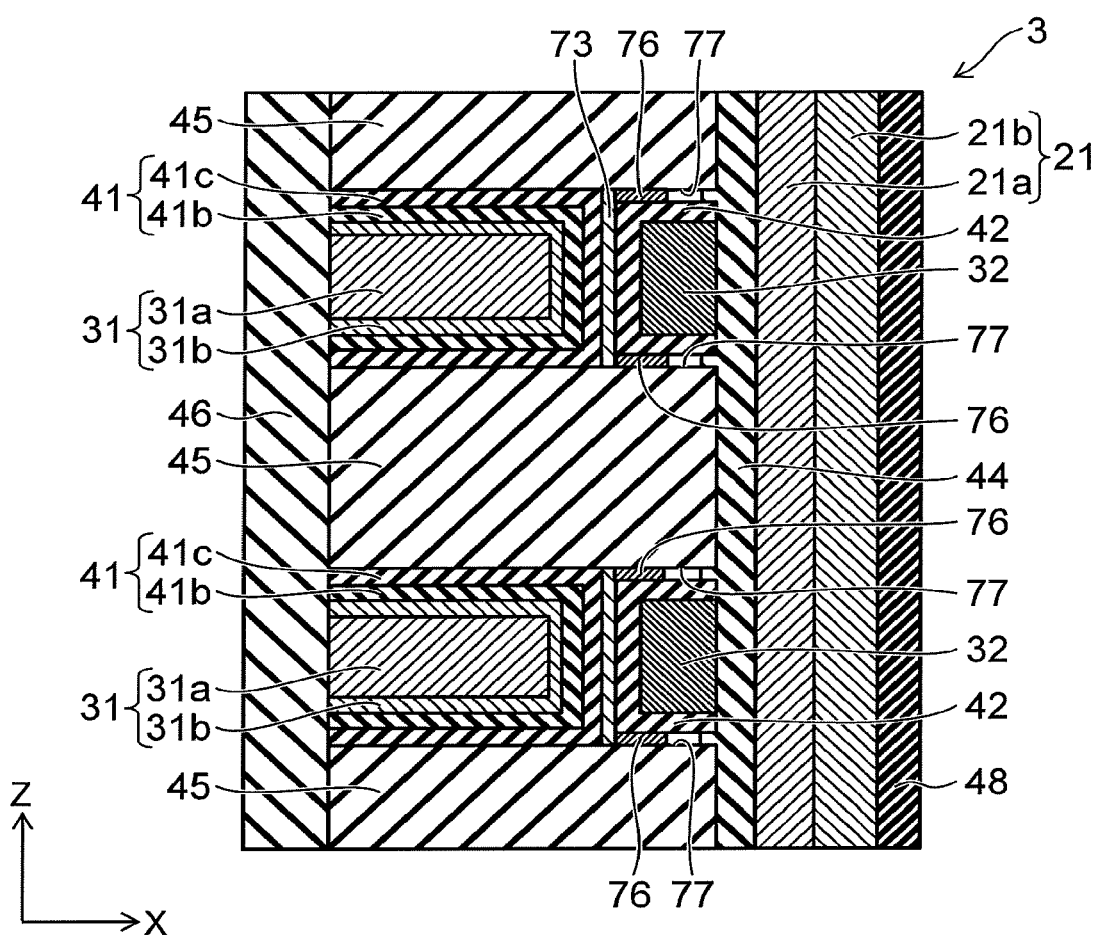
FIG. 26 is a cross-sectional view showing a semiconductor memory device according to a third embodiment.

FIG. 26 is a cross-sectional view showing the semiconductor memory device according to the embodiment.

FIG. 26 shows a region corresponding to FIG. 18A.

As shown in FIG. 26, the semiconductor memory device 3 according to the embodiment differs from the semiconductor memory device 2 according to the second embodiment described above (referring to FIG. 18A) in that a silicon-containing layer 76 is provided instead of the silicon layer 71. The composition of the silicon-containing layer 76 is different from the composition of the floating gate electrode 32; and the silicon-containing layer 76 is, for example, silicon germanium (SiGe) or silicon containing an impurity such as boron (B), phosphorus (P), arsenic (As), antimony (Sb), etc. Also, although the conductive film 73 is formed of a metal silicide, the conductive film 73 contains an impurity such as germanium (Ge), boron (B), phosphorus (P), arsenic (As), antimony (Sb), etc.

Also, compared to the silicon layer 71 of the second embodiment, the end portion of the silicon-containing layer 76 on the tunneling insulating film 44 side in the embodiment is positioned on the control gate electrode 31 side, and an air gap 77 is formed between the silicon-containing layer 76 and the tunneling insulating film 44. Further, a portion of the tunneling insulating film 44 is disposed inside the gap between the inter-layer insulating film 45 and the inter-electrode insulating film 42.

A method for manufacturing the semiconductor memory device according to the embodiment will now be described.

Figure 27:
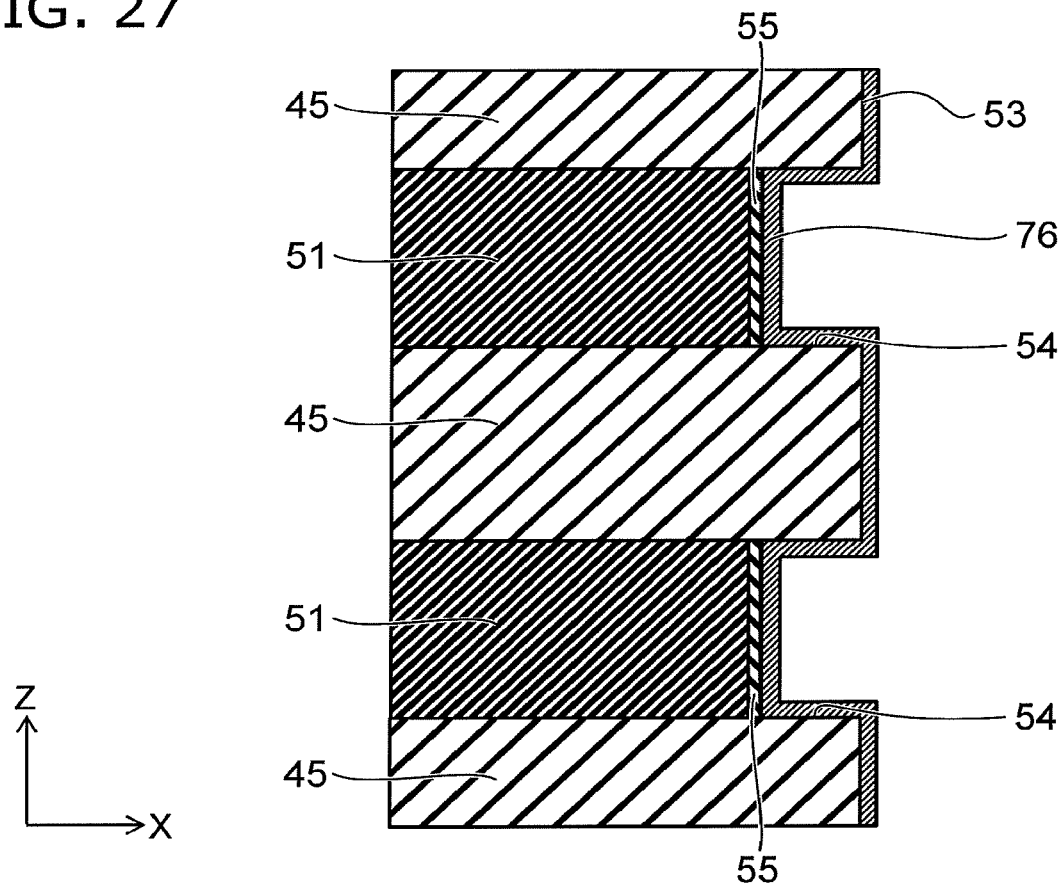
FIG. 27 and FIG. 28 are cross-sectional views showing a method for manufacturing the semiconductor memory device according to the third embodiment.
Figure 28:
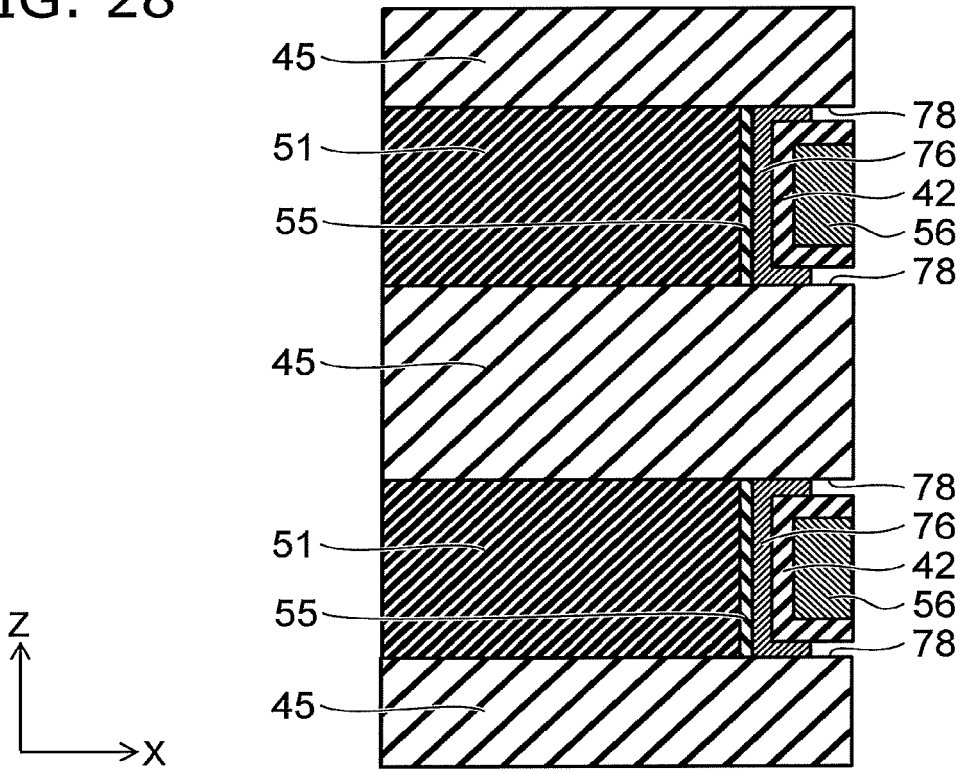

FIG. 27 and FIG. 28 are cross-sectional views showing the method for manufacturing the semiconductor memory device according to the embodiment.

First, the processes shown in FIG. 3 to FIG. 6 are implemented.

Then, as shown in FIG. 27, the silicon-containing layer 76 is formed on the memory trench 53 and the inner surfaces of the recesses 54. For example, the silicon-containing layer 76 is formed of silicon germanium (SiGe), or silicon containing an impurity such as boron (B), phosphorus (P), arsenic (As), antimony (Sb), etc.

Then, as shown in FIG. 28, the inter-electrode insulating film 42 is formed on the inner surface of the memory trench 53; the silicon film 56 that is used to form the floating gate electrode 32 in a subsequent process is formed; and etch-back of the silicon film 56 and the inter-electrode insulating film 42 is performed to cause the silicon film 56 and the inter-electrode insulating film 42 to remain only inside the recesses 54. Then, a gap 78 is formed between the inter-electrode insulating film 42 and the inter-layer insulating film 45 by causing the exposed surface of the silicon-containing layer 76 to recede by performing etch-back of the silicon-containing layer 76 via the memory trench 53. Because the composition of the silicon-containing layer 76 is different from the composition of the silicon film 56 at this time, the etching rate of the silicon-containing layer 76 can be set to be higher than the etching rate of the silicon film 56. Thereby, the gap 78 can be formed by etching the silicon-containing layer 76 substantially without etching the silicon film 56. For example, in the case where the silicon-containing layer 76 is formed of silicon germanium, a (HNO$_3$/HF/H$_2$O) solution is used as an etchant. Also, in the case where the silicon-containing layer 76 is formed of silicon containing boron with a concentration of about $5\times10^{20}$/cm$^3$ or more, choline aqueous solution (TMY) is used as the etchant.

Then, as shown in FIG. 26, the tunneling insulating film 44 is formed on the inner surface of the memory trench 53. Although a portion of the tunneling insulating film 44 enters the gap 78 at this time, the portion of the tunneling insulating film 44 does not reach the silicon-containing layer 76. Thereby, the portion of the gap 78 not filled with the tunneling insulating film 44 becomes the air gap 77.

The subsequent processes are similar to those of the second embodiment described above. However, when causing the silicide reaction to occur between the silicon-containing layer 76 and the metal layer 74, components included in the silicon-containing layer 76 other than silicon, e.g., germanium (Ge), boron (B), phosphorus (P), arsenic (As), antimony (Sb), etc., are incorporated into the conductive film 73 made of the metal silicide. Thus, the semiconductor memory device 3 according to the embodiment is manufactured.

Effects of the embodiment will now be described.

According to the embodiment, by setting the composition of the silicon-containing layer 76 to be different from the composition of the silicon film 56 (the floating gate electrode 32), the gap 78 can be formed by etching the silicon-containing layer 76 preferentially compared to the silicon film 56 in the process shown in FIG. 28. Thereby, as shown in FIG. 26, the silicon-containing layer 76 and the tunneling insulating film 44 can be separated with the air gap 77 interposed. As a result, even if the silicide reaction between the silicon-containing layer 76 and the metal layer 74 progresses excessively, the metal silicide does not contact the tunneling insulating film 44; and the tunneling insulating film 44 does not degrade due to diffusion of the metal atoms inside the metal silicide. Further, degradation of the silicon pillar 21 due to diffusion of the metal atoms into the silicon pillar 21 also is not caused. Therefore, the reliability of the semiconductor memory device according to the embodiment is better.

Otherwise, the configuration, the manufacturing method, and the effects of the embodiment are similar to those of the first embodiment described above.

Fourth Embodiment

A fourth embodiment will now be described.

Figure 29:
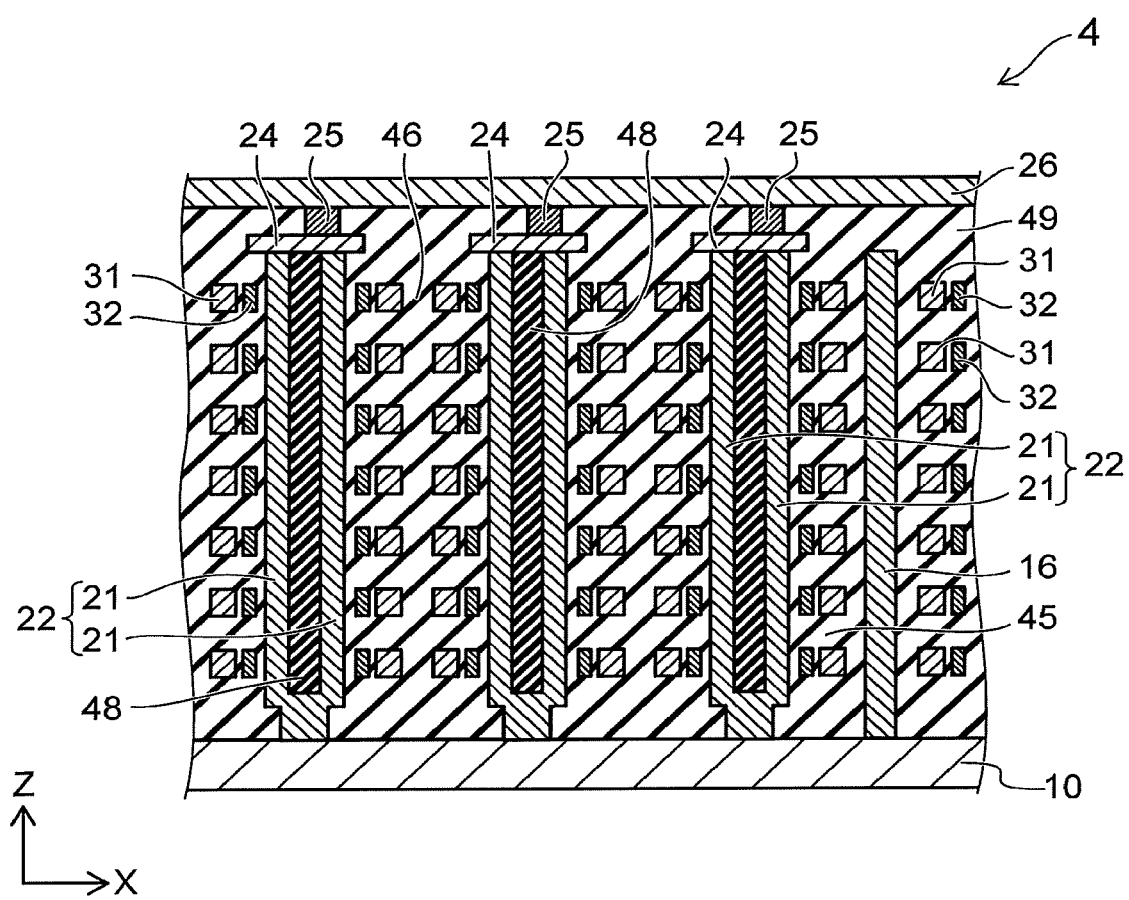
FIG. 29 is a cross-sectional view showing a semiconductor memory device according to a fourth embodiment.

FIG. 29 is a cross-sectional view showing the semiconductor memory device according to the embodiment.

As shown in FIG. 29, the semiconductor memory device 4 according to the embodiment differs from the semiconductor memory device 1 according to the first embodiment described above (referring to FIG. 1A) in that the insulating film 11 and the cell source line 15 are not provided; and the silicon pillars 21 are connected to the silicon substrate 10. An impurity is introduced to the upper layer portion of the silicon substrate 10; and the upper layer portion functions as a cell source line.

Otherwise, the configuration, the manufacturing method, and the effects of the embodiment are similar to those of the first embodiment described above.

Fifth Embodiment

A fifth embodiment will now be described.

Figure 30:
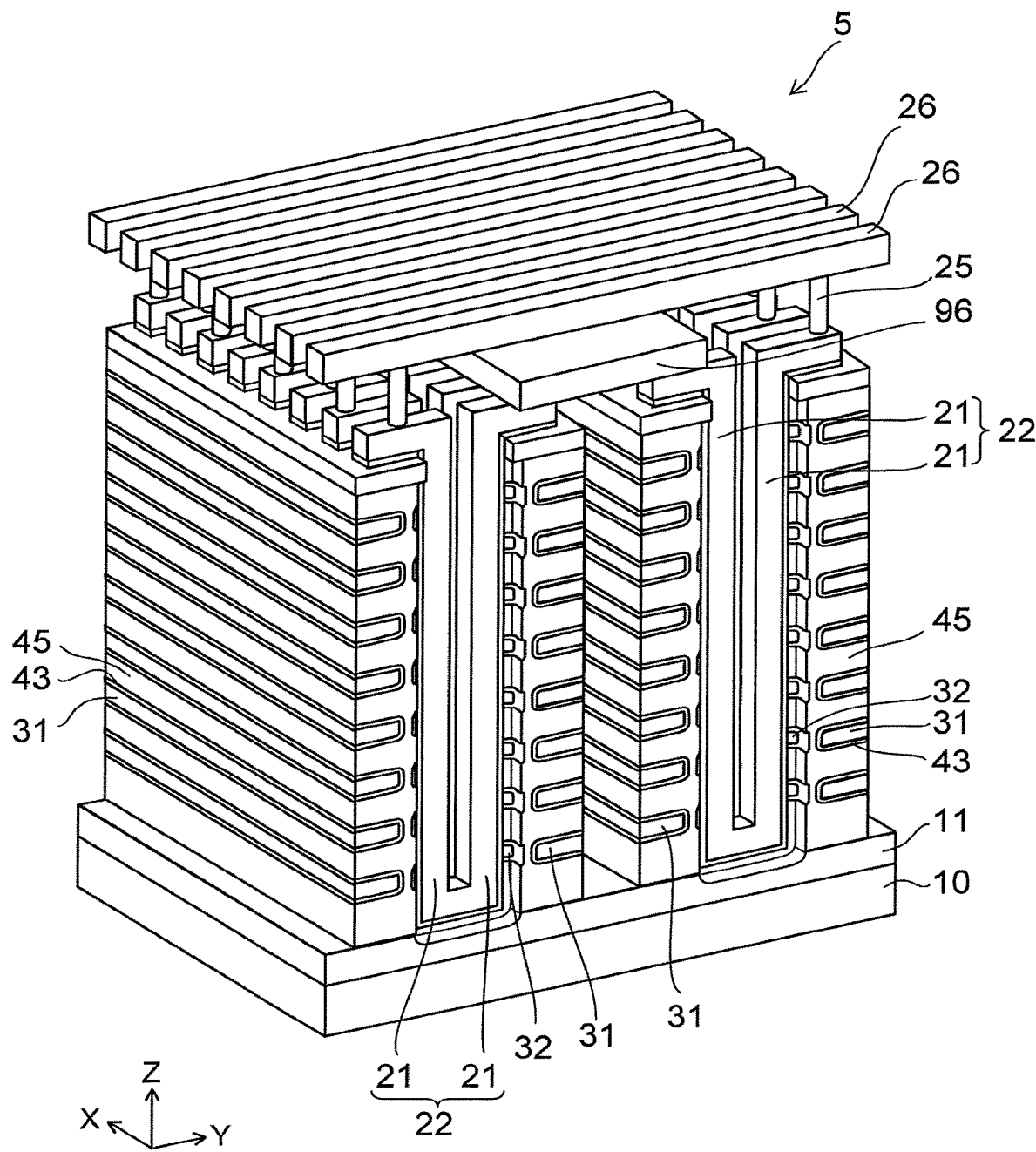
FIG. 30 is a cross-sectional view showing a semiconductor memory device according to a fifth embodiment.

FIG. 30 is a perspective view showing the semiconductor memory device according to the embodiment.

As shown in FIG. 30, the semiconductor memory device 5 according to the embodiment differs from the semiconductor memory device 1 according to the first embodiment described above (referring to FIG. 1A) in that the cell source line 15 and the connection members 24 are not provided; and a source line 96 that extends in the Y-direction is provided between the silicon pillars 21 and the bit lines 26. Also, one of the two silicon pillars 21 included in the pillar pair 22 is connected to the bit line 26; and the other one is connected to the source line 96. The two silicon pillars 21 that are adjacent to each other in the X-direction are connected to each of the source lines 96. The two silicon pillars 21 belong to mutually-different pillar pairs 22.

Otherwise, the configuration, the manufacturing method, and the effects of the embodiment are similar to those of the first embodiment described above.

According to the embodiments described above, a semiconductor memory device and a method for manufacturing the semiconductor memory device can be realized in which the manufacturing is easy and the reliability is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
a semiconductor pillar extending in a first direction;
a first electrode extending in a second direction crossing the first direction;
a second electrode provided between the semiconductor pillar and the first electrode;
a first insulating film provided between the first electrode and the second electrode and on two first-direction sides of the first electrode;
a second insulating film provided between the second electrode and the first insulating film and on two first-direction sides of the second electrode;
a third insulating film provided between the second electrode and the semiconductor pillar, the third insulating film contacting the second insulating film;
a first conductive film provided inside a region interposed between the first insulating film and the second insulating film;
a third electrode being adjacent to the first electrode in a third direction crossing the first and second directions and extending in the second direction;
a fourth electrode provided between the semiconductor pillar and the third electrode;
a fourth insulating film provided between the third electrode and the fourth electrode and on two first-direction sides of the third electrode;
a fifth insulating film provided between the fourth electrode and the fourth insulating film and on two first-direction sides of the fourth electrode;
a sixth insulating film provided between the fourth electrode and the semiconductor pillar, the sixth insulating film being contacted to the fifth insulating film;
a second conductive film provided inside a region interposed between the fourth insulating film and the fifth insulating film;
a first memory cell including the first, second and third insulating films, the first and second electrodes, and the first conductive film; and
a second memory cell including the fourth, fifth and sixth insulating films, the third and fourth electrodes, and the second conductive film, the second memory cell being adjacent to the first memory cell in the third direction,
a thickness of the first conductive film in the third direction being smaller than a thickness of the second electrode in the third direction,
wherein the first conductive film contacts the first insulating film on one third-direction side of the first conductive film, and the first conductive film contacts the second insulating film on another third-direction side of the first conductive film.

2. The device according to claim 1, wherein the first conductive film is substantially not provided on the two first-direction sides of the first electrode and the two first-direction sides of the second electrode.

3. The device according to claim 1, wherein the first conductive film includes titanium nitride.

4. The device according to claim 1, further comprising an inter-layer insulating film provided on two first-direction sides of the first insulating film and two first-direction sides of the second insulating film, the inter-layer insulating film contacting the first insulating film and the second insulating film.

5. The device according to claim 4, wherein the first conductive film contacts the inter-layer insulating film.

6. The device according to claim 1, wherein the first conductive film includes a metal silicide.

7. The device according to claim 6, wherein the first conductive film includes at least one type of substance selected from the group consisting of germanium, boron, phosphorus, arsenic, and antimony.

8. The device according to claim 6, further comprising a silicon layer including silicon and being provided on the two first-direction sides of the second insulating film.

9. The device according to claim 8, wherein an air gap is formed between the silicon layer and the third insulating film.

10. The device according to claim 8, wherein the silicon layer includes at least one type of substance selected from the group consisting of germanium, boron, phosphorus, arsenic, and antimony.

11. The device according to claim 1, wherein the thickness of the first conductive film in the third direction is smaller than a thickness of the second insulating film in the third direction.

* * * * *